US012597475B2

(12) United States Patent
Kojima

(10) Patent No.: US 12,597,475 B2
(45) Date of Patent: Apr. 7, 2026

(54) MEMORY SYSTEM, CONTROL METHOD THEREOF, AND PROGRAM

(71) Applicant: Kioxia Corporation, Tokyo (JP)

(72) Inventor: Yoshihisa Kojima, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 40 days.

(21) Appl. No.: 18/677,727

(22) Filed: May 29, 2024

(65) Prior Publication Data

US 2024/0312533 A1     Sep. 19, 2024

Related U.S. Application Data

(60) Continuation of application No. 18/365,929, filed on Aug. 4, 2023, now Pat. No. 12,033,705, which is a continuation of application No. 18/149,373, filed on Jan. 3, 2023, now Pat. No. 11,776,638, which is a continuation of application No. 17/410,872, filed on
(Continued)

(30) Foreign Application Priority Data

Mar. 22, 2018     (JP) ................................. 2018-055169

(51) Int. Cl.
| | |
|---|---|
| *G11C 16/32* | (2006.01) |
| *G11C 7/04* | (2006.01) |
| *G11C 11/56* | (2006.01) |
| *G11C 16/04* | (2006.01) |
| *G11C 16/08* | (2006.01) |
| *G11C 16/10* | (2006.01) |
| *G11C 16/26* | (2006.01) |
| *G11C 16/34* | (2006.01) |

(52) U.S. Cl.
CPC ................ *G11C 16/32* (2013.01); *G11C 7/04* (2013.01); *G11C 11/5628* (2013.01); *G11C 16/0483* (2013.01); *G11C 16/08* (2013.01); *G11C 16/10* (2013.01); *G11C 16/26* (2013.01); *G11C 16/3495* (2013.01); *G11C 2211/5648* (2013.01)

(58) Field of Classification Search
CPC ..................................................... G11C 16/32
See application file for complete search history.

(56) References Cited

U.S. PATENT DOCUMENTS

| | | | |
|---|---|---|---|
| 8,811,094 B2 | 8/2014 | Lee et al. | |
| 9,025,393 B2 | 5/2015 | Wu et al. | |

(Continued)

*Primary Examiner* — Jason Lappas
(74) *Attorney, Agent, or Firm* — Kim & Stewart LLP

(57)     ABSTRACT

A memory system includes a nonvolatile memory configured to execute one of a plurality of read operations, including a first read operation and a second read operation, and a memory controller configured to issue a read command to the nonvolatile memory to cause the nonvolatile memory to execute one of the plurality of read operations. The memory controller is configured to receive a read request, estimate a reliability level of a result of a read operation to be executed by the nonvolatile memory to read data from a physical address specified in the read request, select one of the first and second read operations to be executed first in a read sequence corresponding to the read request by the nonvolatile memory based on the estimated reliability level, and instruct the nonvolatile memory to execute the selected read operation.

33 Claims, 12 Drawing Sheets

Related U.S. Application Data

Aug. 24, 2021, now Pat. No. 11,574,688, which is a continuation of application No. 17/131,644, filed on Dec. 22, 2020, now Pat. No. 11,145,374, which is a division of application No. 16/237,592, filed on Dec. 31, 2018, now Pat. No. 10,910,073.

(56)                    References Cited

U.S. PATENT DOCUMENTS

| | | | |
|---|---|---|---|
| 9,129,699 B2 | 9/2015 | Suzuki et al. | |
| 9,223,656 B2 | 12/2015 | Kim | |
| 2013/0080858 A1 | 3/2013 | Lee et al. | |
| 2016/0148702 A1 | 5/2016 | Karakulak et al. | |
| 2019/0295669 A1* | 9/2019 | Yang | G11C 16/32 |

* cited by examiner

FIG. 7
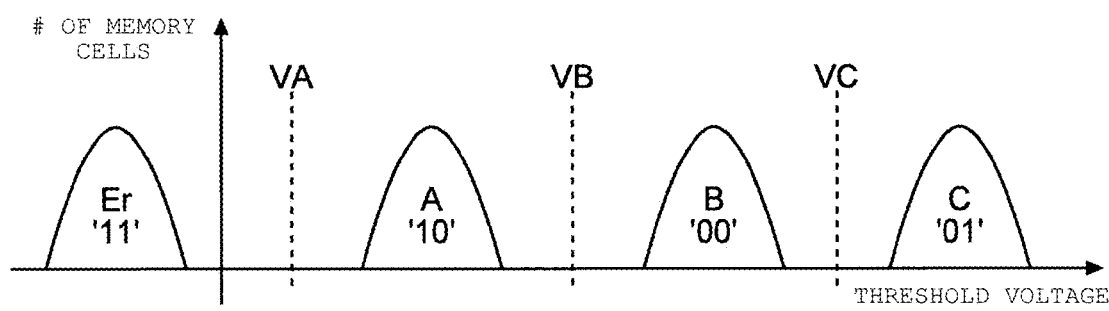
FIG. 8
| PAGE | Er | A | B | C | READ LEVELS | THE NUMBER OF READ LEVELS |
|------|----|----|----|----|-------------|---------------------------|
| LOWER | 1 | 0 | 0 | 1 | VA,VC | 2 |
| UPPER | 1 | 1 | 0 | 0 | VB | 1 |
FIG. 9
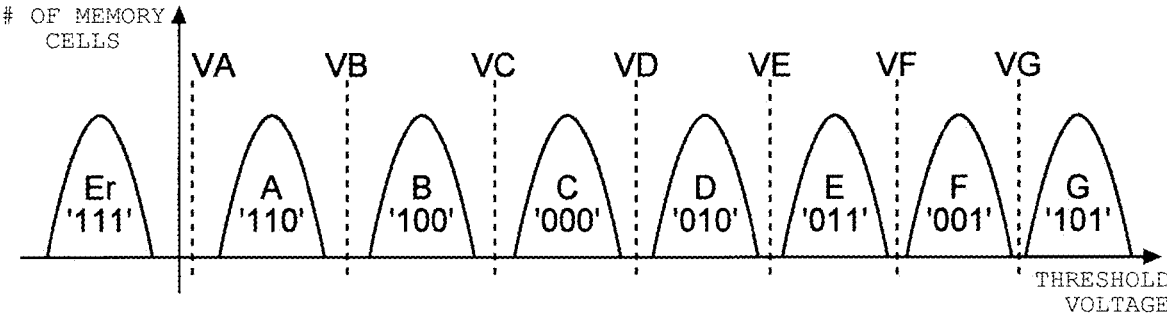
FIG. 10
| PAGE | Er | A | B | C | D | E | F | G | READ LEVELS | THE NUMBER OF READ LEVELS |
|------|----|----|----|----|----|----|----|----|-------------|---------------------------|
| LOWER | 1 | 0 | 0 | 0 | 0 | 1 | 1 | 1 | VA,VE | 2 |
| MIDDLE | 1 | 1 | 0 | 0 | 1 | 1 | 0 | 0 | VB,VD,VF | 3 |
| UPPER | 1 | 1 | 1 | 0 | 0 | 0 | 0 | 1 | VC,VG | 2 |

| PAGE | Er | A | B | C | D | E | F | G | READ LEVELS | THE NUMBER OF READ LEVELS |
|------|----|----|----|----|----|----|----|----|-------------|---------------------------|
| LOWER | 1 | 1 | 1 | 1 | 0 | 0 | 0 | 0 | VD | 1 |
| MIDDLE | 1 | 0 | 0 | 1 | 1 | 1 | 0 | 0 | VA,VC,VF | 3 |
| UPPER | 1 | 1 | 0 | 0 | 0 | 1 | 1 | 0 | VB,VE,VG | 3 |

MEMORY SYSTEM, CONTROL METHOD THEREOF, AND PROGRAM

CROSS-REFERENCE TO RELATED APPLICATIONS

This application is a continuation of U.S. patent application Ser. No. 18/365,929, filed Aug. 4, 2023, which is a continuation of U.S. patent application Ser. No. 18/149,373, filed Jan. 3, 2023, now U.S. Pat. No. 11,776,638, issued Oct. 3, 2023, which is a continuation of U.S. patent application Ser. No. 17/410,872, filed Aug. 24, 2021, now U.S. Pat. No. 11,574,688, issued Feb. 7, 2023, which is a continuation of U.S. patent application Ser. No. 17/131,644, filed Dec. 22, 2020, now U.S. Pat. No. 11,145,374, issued Oct. 12, 2021, which is a divisional of U.S. patent application Ser. No. 16/237,592, filed Dec. 31, 2018, now U.S. Pat. No. 10,910, 073, issued Feb. 2, 2021, which application is based upon and claims the benefit of priority from Japanese Patent Application No. 2018-055169, filed Mar. 22, 2018, the entire contents of which are incorporated herein by reference.

FIELD

Embodiments described herein relate generally to a memory system, a control method thereof, and a program.

BACKGROUND

A read operation for reading data from a NAND flash memory (hereinafter, referred to as a NAND memory) includes a plurality of the read methods with different read time periods and reliability levels. The read time period is, for example, a time from when a read request is issued with respect to the NAND memory until the data according to this request becomes ready to be transferred from the NAND memory. On the other hand, the reliability level corresponds to accuracy of the data read from the NAND memory. For example, it means that the reliability is high in a case where the number of error bits included in the read data is small, and the reliability is low in a case where the number of error bits is large.

Here, there is a trade-off relationship between the read time and reliability. Therefore, in the related art, generally, a read method with a short read time period is first executed, and in a case where the read fails, the read method to execute a read method focusing on the reliability is executed next.

BRIEF DESCRIPTION OF THE DRAWINGS

FIG. 7 is a diagram illustrating an example of the threshold voltage distribution and read levels in an MLC mode.

FIG. 8 is a diagram illustrating an example of read levels and the number of the read levels assigned to lower and upper pages of the MLC mode shown in FIG. 7.

FIG. 9 is a diagram illustrating an example of a threshold voltage distribution and read levels in a TLC mode.

FIG. 10 is a diagram illustrating an example of read levels and the number of the read levels assigned to lower, middle, and upper pages of the TLC mode shown in FIG. 9.

DETAILED DESCRIPTION

Embodiments provide a memory system, a control method the same, and a program capable of shortening a read time period without lowering reliability level.

In general, according to one embodiment, there is provided a memory system including a nonvolatile memory configured to execute one of a plurality of read operations, including a first read operation and a second read operation, and a memory controller configured to issue a read command to the nonvolatile memory to cause the nonvolatile memory to execute one of the plurality of read operations. The memory controller is configured to receive a read request, estimate a reliability level of a result of a read operation to be executed by the nonvolatile memory to read data from a physical address specified in the read request, select one of the first and second read operations to be executed first in a read sequence corresponding to the read request by the nonvolatile memory based on the estimated reliability level, and instruct the nonvolatile memory to execute the selected read operation.

Hereinafter, a memory system, a control method the same, a program according to embodiments will be described in detail. The present disclosure is not limited by the following embodiments.

First Embodiment

Figure 1:
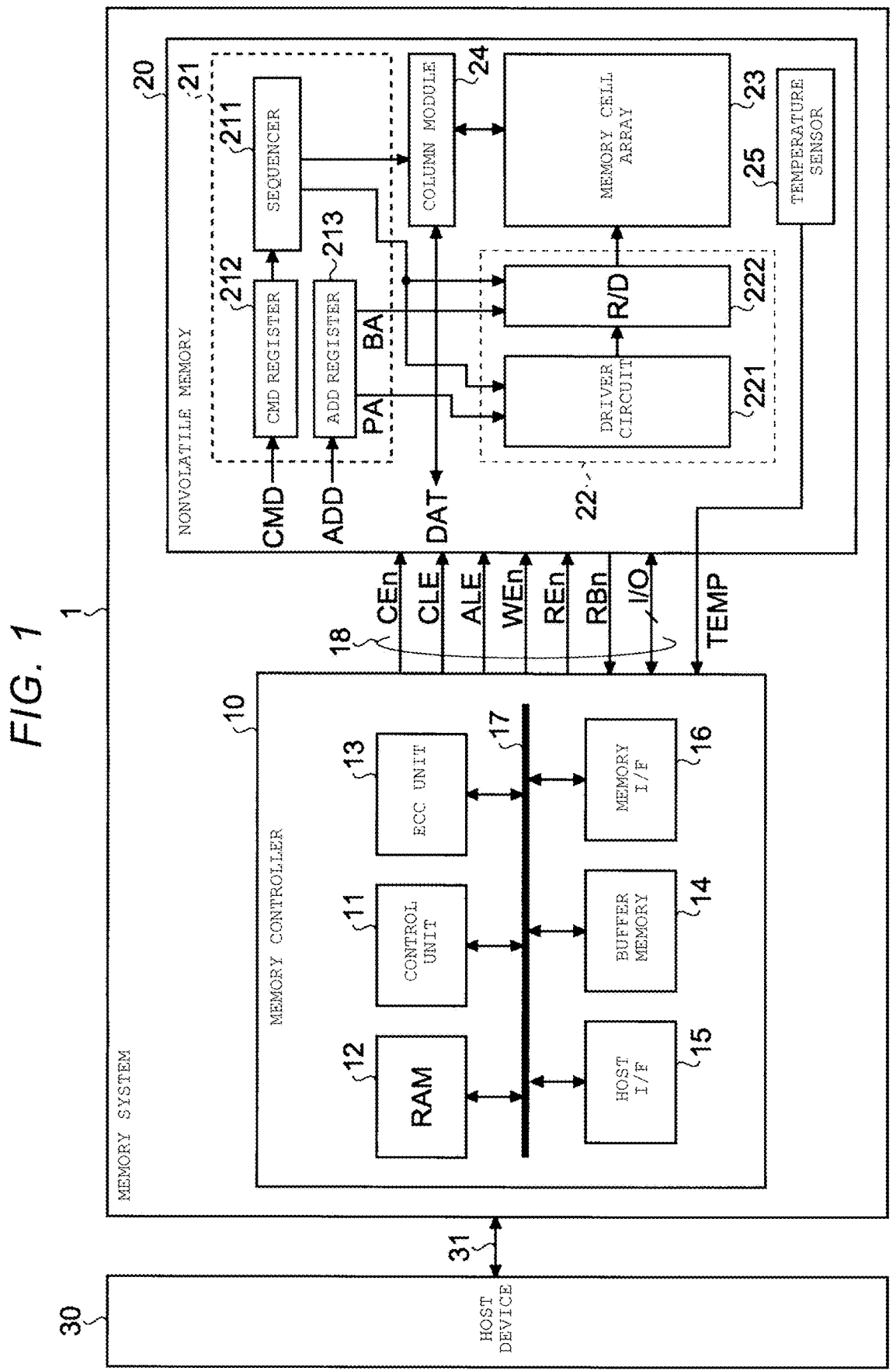
FIG. 1 is a block diagram illustrating a configuration example of a memory system related to a first embodiment.

First, a memory system, a control method, and a program thereof related to a first embodiment will be described in detail with reference to the drawings. FIG. 1 is a block diagram illustrating a configuration example of a memory system related to the first embodiment. A memory system 1 includes a nonvolatile memory 20 and a memory controller 10. The memory system 1 is connectable to a host device 30, and FIG. 1 shows a state where the memory system is connected to the host device 30. The host device 30 may be, for example, an electronic device such as a personal computer, a portable terminal, or the like.

The memory system 1 may be any of memory systems including an SSD (Solid State Drive) and a memory card, in which the memory controller 10 and the nonvolatile memory 20 are formed as one package.

The nonvolatile memory 20 is a nonvolatile memory that stores data in a nonvolatile manner, and is, for example, a NAND flash memory (hereinafter, simply referred to as a NAND memory). In the following description, a case where the NAND memory is used as the nonvolatile memory 20 is given as an example. Alternatively, as the nonvolatile memory 20, a three-dimensional structure flash memory, a resistive random access memory (ReRAM), a ferroelectric random access memory (FeRAM), a magneto-resistive random access memory (MRAM) or the like other than the NAND memory may be used. In addition, it is not necessary that the nonvolatile memory 20 is a semiconductor memory, and the present embodiment may be applied with respect to various storage media other than the semiconductor memory. The memory controller 10 is an integrated circuit configured as a system-on-a-chip (SoC), for example. Part or all of the operations of the constituent elements of the memory controller 10 described below may be implemented by a central processing unit (CPU) executing firmware or may be implemented by hardware.

The memory controller 10 is connected to the nonvolatile memory 20 via a memory bus 18, and is connected to the host device 30 by a host bus 31. The memory controller 10 controls writing to the nonvolatile memory 20 according to a write request from the host device 30. In addition, in accordance with a read request from the host device 30, reading is performed on the nonvolatile memory 20. The host device 30 has a configuration of a computer. The computer may be, for example, a personal computer, a server device, a portable information device, a digital still camera, or the like. In addition, the host bus 31, conforms to a predetermined standard such serial advanced technology attachment (SATA), a serial attached SCSI (SAS), a peripheral component interconnect Express® (PCIe), or an NVM Express®.

Signals are transmitted via the memory bus 18 according to a memory interface standard of the memory interface connecting the memory controller 10 and the nonvolatile memory 20. In a case where the memory interface standard is a NAND interface standard, detailed examples of this signal include a chip enable signal CEn, a command latch enable signal CLE, an address latch enable signal ALE, a write enable signal WEn, a read enable signal REn, a ready and busy signal RBn, an input/output signal I/O, and the like.

The signal CEn is a signal for enabling the nonvolatile memory 20 to operate. The signal CLE is a signal for indicating to the nonvolatile memory 20 that the input/output signal I/O includes a command. The signal ALE is a signal for indicating to the nonvolatile memory 20 that the input/output signal I/O includes an address. The signal WEn is a signal for causing the nonvolatile memory 20 to fetch data to be written from the input/output signal I/O. The signal REn is a signal for causing the nonvolatile memory 20 to output read data to the input/output signal I/O. The ready and busy signal RBn is a signal indicating whether the nonvolatile memory 20 is in a ready state (a state where it can receive a command from the memory controller 10) or a busy state (a state where a command from the memory controller 10 cannot be received). The input/output signal I/O is, for example, an 8-bit signal. The input/output signal I/O contains data transmitted and received between the nonvolatile memory 20 and the memory controller 10, and includes a command, an address, write data (data to be written to the nonvolatile memory), read data (data read from the nonvolatile memory) or the like.

A signal TEMP indicating a temperature measured by a temperature sensor 25 for measuring the temperature of the nonvolatile memory 20 is also supplied from the nonvolatile memory 20 to the memory controller 10. The temperature sensor 25 may be built in the nonvolatile memory 20 as shown in FIG. 1, or may be a discrete component provided outside the nonvolatile memory 20. In addition, a signal line through which the signal TEMP output from the temperature sensor 25 is transmitted may be provided in the memory bus 18 (e.g., using the input/output signal I/O) or may be an independent signal line different from the memory bus 18.

The memory controller 10 includes a host interface (host I/F) 15, a random access memory (RAM) 12, a control unit 11, a buffer memory 14, a memory interface (memory I/F) 16, and an ECC unit (ECC) 13. The host I/F 15, the RAM 12, the control unit 11, the buffer memory 14, the memory I/F 16, and the ECC unit 13 are connected to each other via an internal bus 17.

The host I/F 15 is connected to the host device 30 via the host bus 31, and transfers a command and data received from the host device 30 to the control unit 11 and the buffer memory 14, respectively. In addition, in response to a command from the control unit 11, the host I/F 15 transfers the data in the buffer memory 14 to the host device 30.

The control unit 11 includes an information processing device such as a Central Processing Unit (CPU), for example, and controls the overall operation of the memory controller 10. For example, in a case where a write request is received from the host device 30, the control unit 11 issues a write command corresponding to the write request through the memory I/F 16. Similarly upon reading, if a read request is received from the host device 30, the read command corresponding to the read request is issued through the memory I/F 16. On the other hand, in the case of deleting data, for example, the control unit 11 issues an erasing command through the memory I/F 16 as part of processing such as garbage collection. In addition to garbage collection, the control unit 11 executes various processes for managing the nonvolatile memory 20, such as wear leveling, refreshing, and patrol reading.

The memory I/F 16 is connected to the nonvolatile memory 20 via the memory bus 18, and controls communication with the nonvolatile memory 20. The memory I/F 16 outputs the signal ALE, the signal CLE, the signal WEn, and the signal REn to the nonvolatile memory 20 on the basis of the command received from the control unit 11. In addition, at the time of writing, the write command issued by the control unit 11 and the write data in the buffer memory 14 are transferred to the nonvolatile memory 20 as the input/output signal I/O. At the time of reading, the memory I/F 16 transfers the read command issued by the control unit 11 to the nonvolatile memory 20 as the input/output signal I/O. In addition, the memory I/F 16 receives the data read from the nonvolatile memory 20 as the input/output signal I/O, and transfers the data to the buffer memory 14.

The buffer memory 14 functions as a memory area for temporarily storing write data or read data. The buffer memory 14 may be a dynamic random access memory (DRAM), a static random access memory (SRAM), or the like.

The RAM 12 is a semiconductor memory such as a DRAM, for example, and is used as a work area of the control unit 11. The RAM 12 is loaded with firmware controlling the nonvolatile memory 20 and various types of tables such as an address conversion table indicating a corresponding relationship between a logical address designated by the host device 30 and the physical address of the nonvolatile memory 20.

The ECC unit 13 (which is implemented as a circuit in one embodiment) performs encoding and decoding of data for error detection and error correction in the read data. Specifically, the ECC unit 13 codes the data to be written in the nonvolatile memory 20 (write data). Further, the ECC unit 13 decodes the data read from the nonvolatile memory 20 (read data). The ECC unit 13 executes the error detection and the error correction on the read data by decoding. In a case where the error correction fails, the ECC unit 13 notifies the control unit 11 of the failure in the error correction. It is possible to apply an algorithm that uses a reed-solomon (RS) code, a bose-chaudhuri-hocquenghem (BCH) code, a low density parity check (LDPC) code, or the like as encoding and decoding algorithms employed by the ECC unit 13.

For example, the ECC unit 13 generates a parity based on the data and attaches the parity to the data. At the time of writing, the data with the parity attached is written as encoded data in the nonvolatile memory 20. At the time of reading, the ECC unit 13 generates a syndrome based on the parity, and determines a presence or absence of the error in the read data. In a case where the error is included in the data, the ECC unit 13 identifies the position of the error and corrects the error. The number of error bits that can be corrected in the ECC unit 13 is determined by the number of bits of parity, for example. In a case where the data includes a larger number of error bits than the number of correctable error bits, the ECC unit 13 cannot correct the error bits. Therefore, in this case, the error correction carried out by the ECC unit 13 fails.

The nonvolatile memory 20 includes a command processing unit 21, a driving unit 22, a memory cell array 23, a column module 24, and the temperature sensor 25. The command processing unit 21 includes a sequencer 211, a command register (CMD register) 212, and an address register (ADD register) 213. The driving unit 22 includes a driver circuit 221 and a row decoder (R/D) 222.

The memory cell array 23 includes one or more blocks. Each block is an aggregate of nonvolatile memory cells (which are memory cell transistors MT), and each memory cell is associated with a row and a column. The memory cell array 23 stores data supplied from the memory controller 10.

The row decoder 222 selects a block to be accessed, and further selects a row in the selected block.

The driver circuit 221 supplies a voltage to the selected block via the row decoder 222.

The column module 24 includes, for example, a sense amplifier and a data latch including a plurality of latch circuits. In the write operation, the column module 24 transfers the write data received from the memory controller 10 to the memory cell array 23. In the read operation, the column module 24 senses data read from the memory cell array 23 and performs various operations to obtain the read data. The column module 24 outputs the obtained read data to the memory controller 10. In FIG. 1, the write data transferred to the memory cell array 23 and the read data transferred to the memory controller 10 is represented as DAT.

The address register 213 holds the address ADD received from the memory controller 10. The command register 212 holds the command CMD received from the memory controller 10.

The sequencer 211 controls the operation of the entire nonvolatile memory 20 based on the command CMD stored in the command register 212.

The temperature sensor 25 measures the temperature around the memory cell array 23 periodically or as necessary and outputs the signal TEMP indicating the measured temperature to the memory controller 10.

In the nonvolatile memory 20, in general, writing and reading are performed in units of data called pages, and erasing is performed in units of data called blocks. In the present embodiment, a plurality of memory cells connected to a same word line are referred to as a memory cell group of the word line. In a case where each memory cell is a single level cell (SLC) storing one bit, one memory cell group corresponds to one page. In the case where each memory cell stores a plurality of bits such as a multi-level cell (MLC) storing 2 bits, a triple-level cell (TLC) storing 3 bits, or a quad-level cell (QLC) storing 4 bits, one memory cell group corresponds to a plurality of pages. In addition, each memory cell is connected to a word line and also to a bit line. Therefore, each memory cell can be identified by an address identifying the word line and an address identifying the bit line.

In the embodiments, the sequencer 211 executes one or more of a plurality of kinds of read operations (also referred to as read methods) with different read time periods and reliability levels. In this description, the FAST read operation, the normal read operation, the retry shift read operation, the adjacent word line compensation read operation, and the tracking read operation are given as examples of the read operations (or read methods) executed by the sequencer 211. The memory controller 10 outputs an instruction to selectively and sequentially (i.e., one after another) execute these operations to the sequencer 211 according to a preset read sequence.

Here, the normal read operation is a normal read operation using a reference read level that is set in advance as a read voltage (also referred to as a read level) to be applied to a word line at the time of reading. A read operation in which one of the read levels is used is referred to as a single level read operation, and a read operation in which two or more of the read levels are used is referred to as a multi-level read operation.

The FAST read operation is a read operation in which the read time period is shortened by shortening the application time or the like of the read level, for example, relative to the normal read.

The retry shift read operation is a read operation executed when the target data cannot be restored by a FAST read operation, a normal read operation, or the like, for example, and is a retry read operation in which the read level is shifted from the reference read level in the high voltage direction or in the low voltage direction.

The adjacent word line compensation read operation is, for example, a read operation for selecting or correcting a value read from a target memory cell on the basis of a value read from a memory cell in an adjacent word line to the word line of the target memory cell.

The tracking read operation is, for example, a read operation in which a histogram of the distribution of threshold voltages programmed in a plurality of memory cells included in a corresponding page (threshold voltage distribution) is generated by executing a single level read operation multiple times while shifting the read level with a predetermined step and executing reading using the read level corrected on the basis of the generated histogram. The tracking read operation includes a read method executed under the control of the memory controller 10 and a read method executed in the nonvolatile memory 20 independently of control from the memory controller 10 (also referred to as self-adjusting read or on-chip tracking read). However, in the present embodiment, either read method may be used.

In the read sequence illustrated in the present embodiment, the read operation is executed in the order of the FAST read operation, the normal read operation, the retry shift read operation, the adjacent word line compensation read operation, and the tracking read operation. However, it is Pnot limited to this order. For example, in place of the flow from the normal read operation to the retry shift read operation, a plurality of retry shift read operations with different read level shift amounts may be sequentially executed. In this case, for the first retry shift read operation, the shift amount of the immediately preceding successful read operation may be used. In addition, in the following description, the sequence of the second and subsequent read operations in the read sequence is referred to as a retry read sequence.

Figure 2:
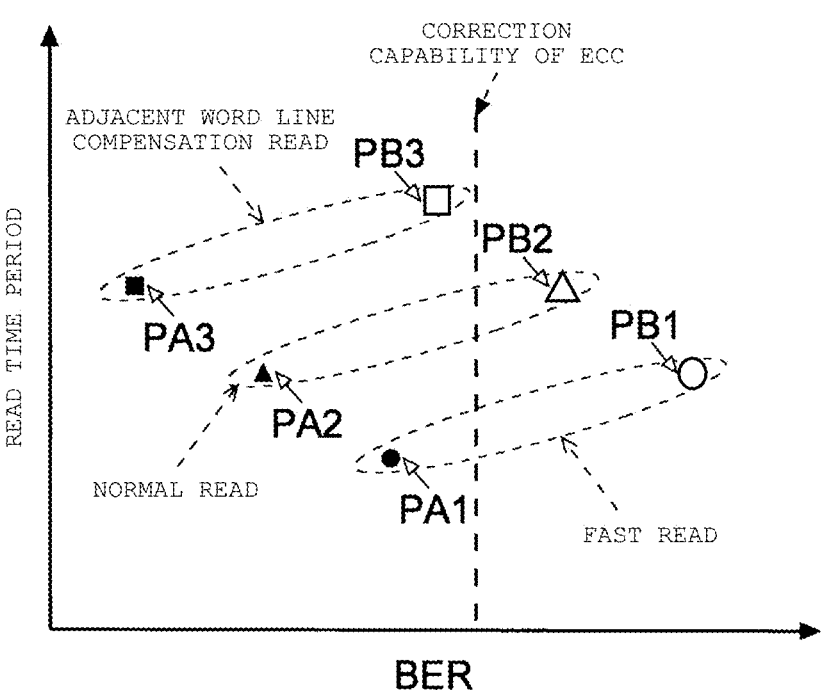
FIG. 2 is a diagram illustrating an example of a relationship between a read time period and a BER in a read operation.

Here, the relationship between the read time period and a bit error rate (BER) for the FAST read operation, the normal read operation, and the adjacent word line compensation read operation among the above read operations will be described. FIG. 2 is a diagram illustrating an example of the relationship between the read time period and the BER. In FIG. 2, the horizontal axis represents the BER and the vertical axis represents the read time period. In addition, the black symbols PA1 to PA3 represent the relationship when executing the respective read operations for a certain page A, and the white symbols PB1 to PB3 represent the relationship when executing the respective read operations for page B different from the page A. Furthermore, the PA1 and PB1 represent the relationship of FAST read operation, the PA2 and PB2 represent the relationship of normal read operation, and the PA3 and PB3 represent the relationship of the adjacent word line compensation read operation.

As shown in FIG. 2, among the FAST read operation, the normal read operation, and the adjacent word line compensation read operation, the FAST read operation has the shortest read time period and the adjacent word line compensation read operation has the longest read time period. On the other hand, for the BER, the adjacent word line compensation read operation has the lowest BER and the FAST read operation has the highest BER. This indicates that adjacent word line compensation read operation is more reliable than the FAST read operation.

In FIG. 2, it is assumed that the ECC unit 13 has a certain error correction capability. The error correction capability is, for example, the number of error bits included in the read data that can be corrected. Under such an assumption, regarding the page A, error correction can be successfully performed by the ECC unit 13, even for read data obtained by either FAST read operation, normal read operation, or adjacent word line compensation read operation. On the other hand, regarding the page B, although the read data obtained by the adjacent word line compensation read operation can be successfully corrected, the read data obtained by the FAST read operation or normal read operation cannot be corrected.

In such a case, when the read sequence for executing the read operation is executed in order from the FAST read operation, as to the page A, there is a high possibility that the error correction can be successfully performed on the read data obtained by the first FAST read operation for page A, but as to the page B, there is a low possibility that the error correction of read data obtained by the FAST read operation and the normal read operation. In that case, the read operations employing the FAST read operation and the normal read operation are wasted, thus increasing read latency.

In the present embodiment, the read operation to be executed first in the read sequence is selectively switched on the basis of the reliability level estimated in the case where it is assumed that the read operation is performed for each page. Accordingly, the present embodiment provides a memory system, a control method thereof, and a program capable of reducing read latency without lowering the reliability.

Figure 3:
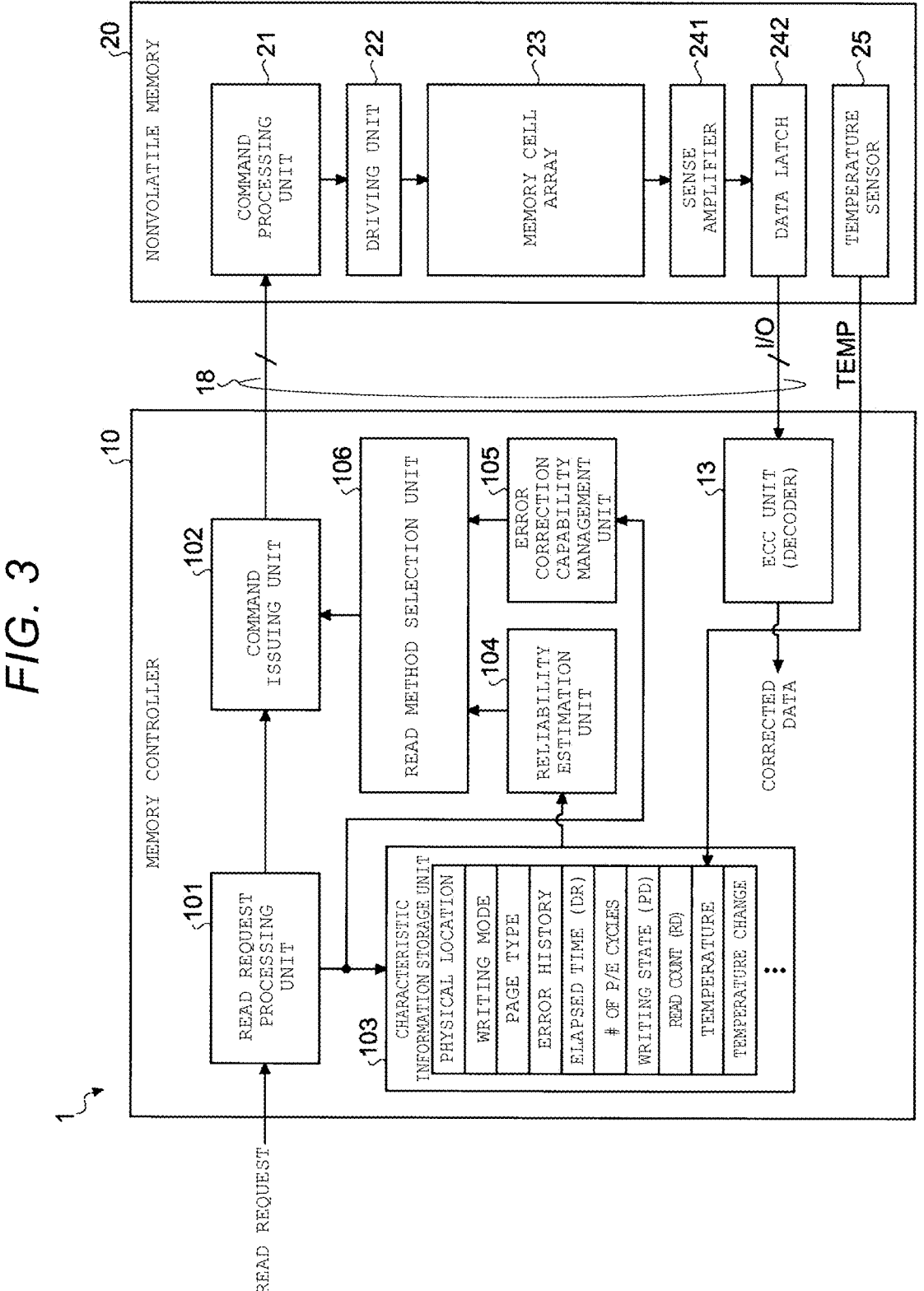
FIG. 3 is a functional block diagram focusing on a configuration for executing a read operation of a memory controller according to the first embodiment.

FIG. 3 is a functional block diagram focusing on the configuration for executing the read operation of the memory controller according to the present embodiment. In FIG. 3, the configuration of the nonvolatile memory 20 is simplified for clarification of the explanation.

FIG. 3 illustrates functional units of the memory controller 10 according to the present embodiment for carrying out a read operation. The functional units include, for example, a read request processing unit 101, a command issuing unit 102, a characteristic information storage unit 103, a reliability estimation unit 104, an error correction capability management unit 105, and a read method selection unit 106 as a configuration at the time of read operation. The read request processing unit 101, the command issuing unit 102, the characteristic information storage unit 103, the reliability estimation unit 104, the error correction capability management unit 105, and the read method selection unit 106 are implemented by units 11 to 17 of the memory controller 10 illustrated in FIG. 1.

The read request processing unit 101 receives a read request input from the host device 30, for example. However, when an event accompanied by a read operation such as garbage collection, refresh, patrol read, or the like occurs, for example, it is not limited to the read request from the host device 30, but an internal execution request a of read operation (hereinafter, also referred to as a read request) from the control unit 11 or the like.

When receiving the read request, the read request processing unit 101 instructs the command issuing unit 102 to issue the read command, and inputs a physical address corresponding to a logical address designated by the read request to the characteristic information storage unit 103 and the error correction capability management unit 105. With respect to this, the characteristic information storage unit 103 outputs information sufficient to estimate the reliability level estimated in a case where it is assumed that each read operation is performed on a page designated by the physical address (such information hereinafter referred the to as characteristic information), to the reliability estimation unit 104. The read operation for which the reliability level is estimated may include at least the FAST read operation, and in a case where other read operations other than the FAST read operation are to be skipped, the reliability level of the other read operations to be skipped may be estimated.

On the other hand, the error correction capability management unit 105 outputs the information indicating an error correction code designated by the control unit 11 in the ECC unit 13 for the page designated by the input physical address or information indicating the correction capability (hereinafter, referred to as correction capability information) to the read method selection unit 106.

Examples of the characteristic information include a physical position, a writing mode, a page type, an error history, an elapsed time (expressed as data retention: DR), the number of program/erase cycles (P/E cycles), a writing state (expressed as program disturb: PD), the read count (expressed as read disturb: RD), a temperature, a temperature change, and the like.

"Physical position" is information determined from the physical address corresponding to the logical address designated by the read request, which indicates whether the page to be read is in a shallow layer or in a deep layer in a stacked structure of the memory cell array 23 having a 3-dimensional structure.

The "writing mode" is information indicating the writing mode of the read target memory cell used when the data to be read has been written in the read target memory cell and may indicate the SLC mode, the MLC mode, the TLC mode, the QLC mode, or the like. The SLC mode is a writing mode in which 1-bit of data is written in one memory cell, and the MLC mode is a writing mode in which 2-bit data is written in one memory cell, and the TLC mode is a writing mode 3-bit data is written in one memory cell, and the QLC mode is a writing mode in which 4-bit data is written in one memory cell.

The "page type" is information for specifying the page in which the read target data is stored. For example, in a case where each memory cell including the memory cell array 23 is written in the TLC mode, the page type is information that specifies one of the LOWER page, the MIDDLE page, and the UPPER page.

The "error history" is information related to an error included in data read from a corresponding physical address in the past, for example, information such as a fail bit count (FBC), the BER, the frequency of successful error correction, and the frequency of failed error correction. This error history may be generated, for example, as a result of decoding executed by the ECC unit 13 on data read from the corresponding physical address in the past. The FBC is, for example, the number of error bits included in an ECC frame, or in a page.

The "elapsed time (data retention: DR)" is the elapsed time since data has been written to the corresponding physical address. The elapsed time may be a real time, or may be a value obtained by converting real time in consideration of temperature and/or a degree of fatigue of the memory cell. For example, a net elapsed time becomes longer when the temperature during the DR baking is higher, and the net elapsed time becomes longer when the degree of fatigue of the memory cell is larger.

The "number of program/erase cycles (P/E cycles)" of a block is the cumulative number of erasing operations executed in the past for the block, and is an index representing the degree of fatigue of each block. The number of P/E cycles may be managed not only in units of blocks but also in units of pages or memory cells. In addition to the number of P/E cycles, the degree of fatigue of each block may be expressed as a value in consideration of the time interval from a certain erasing operation to the next erasing operation (i.e., a dwell time), the temperature in which a P/E cycling has been executed, and the like. For example, performing the write and erasing operation in a lower temperature results in a higher degree of the net fatigue. In addition, when the time interval from a certain erasing operation to the next erasing operation is short, the degree of the net fatigue is high.

The "writing state (program disturb: PD)" is information regarding a block or a word line indicating whether or not writing of data to the block, the word line, or an adjacent word line of the word line is completed. In a case where writing to the block is not finished, i.e., the block is not filled up with data (such a block is referred to as an open block), the reliability level of data read from a page around the last written page of the block may be degraded compared to a case of reading data from a closed block (which has already been filled up with data). A writing state of a word line, instead of a block, may be used in a case where a state of a memory cell is finalized with a plurality of steps of programming. For example, assume a case where an LM sequence programming (where a lower page and an upper page are programmed in two steps) is applied in an MLC mode. A reliability level of data read from a word line with only a lower page programmed may be lower than that of data read from a word line with both of a lower page and an upper page programmed. In addition, a reliability level of data read from a word line (a target word line) may be affected by a writing state of a word line adjacent to the target word line. For example, a reliability level may be lower in a case where the adjacent word line is not programmed at all (i.e., in an erased state) or not programmed with all steps of the programming than that in a case where the adjacent word line is programmed with all steps.

The "read count (read disturb: RD)" is the number of read operations executed after writing the corresponding data to the block including the page specified by the corresponding physical address. A larger read count will result in a higher BER.

The "temperature" is information indicating the current temperature or the latest temperature of the memory cell array 23 or a vicinity of the memory cell array 23 measured by the temperature sensor 25.

The "temperature change" is information indicating the difference between the temperature at the time of writing the data to be read and the current or latest temperature measured by the temperature sensor 25.

The characteristic information storage unit 103 outputs one or more information items described above to the reliability estimation unit 104 in accordance with the instruction from the read request processing unit 101. With respect to this, the reliability estimation unit 104 uses all or a part of the characteristic information given from the characteristic information storage unit 103 to estimate an index (hereinafter, referred to as a reliability index) indicating the reliability level estimated, in a case where it is assumed that each read operation is executed with respect to the page corresponding to the logical address designated by the read request and outputs the estimated reliability index to the read method selection unit 106. For example, the reliability estimation unit 104 estimates the FBC of the data to be read using all or a part of the given characteristic information and outputs the estimated FBC (hereinafter, referred to as the estimated FBC) as a reliability index to the read method selection unit 106. However, the reliability index may not necessarily be numerical information such as the FBC. Alternatively, any information for distinguishing two levels of "high" and "low" reliability, for example, may be used.

On the other hand, the error correction capability management unit 105 manages the encoding method or the correction capability thereof, which the control unit 11 determines with respect to the data stored in each page and applied by the ECC unit 13. For example, when the control unit 11 determines an encoding method for encoding the data to be written, the control unit 11 notifies the error correction capability management unit 105 of the information indicating the determined encoding method and/or the correction capability (hereinafter, referred to as correction capability information) and the physical address indicating a storage position (page position) of the data to be written. The error correction capability management unit 105 manages the physical address and the correction capability in correlation with the physical address and the correction capability information given from the control unit 11. With respect to the input of the physical address from the read request processing unit 101, the error correction capability management unit 105 outputs the correction capability information associated with this physical address to the read method selection unit 106. In addition to the classification based on the difference between the error correction codes to be adopted, the classification based on various factors such as a coding rate may be applied.

When the reliability index (e.g., corresponding to the estimated FBC) relating to the page to be read is given from the reliability estimation unit 104, the read method selection unit 106 selects the read operation to be executed first in the read sequence on the basis of the reliability index. For example, in a case where the estimated FBC is high, that is, in a case where it is estimated that the reliability level at the time of executing the FAST read operation to the corresponding page is low, for example, the read method selection unit 106 skips the FAST read operation with low reliability level and selects the normal read as the read operation to be executed first. On the other hand, in a case where the estimated FBC is low, that is, in a case where it is estimated that the reliability level is high when executing the FAST read operation on the corresponding page, for example, the read method selection unit 106 selects the FAST read as the read operation to be executed first.

In addition to the reliability index given from the reliability estimation unit 104, or in addition to the reliability index, the read method selection unit 106 may select the read operation corresponding to the page on the basis of the correction capability information given from the error correction capability management unit 105. For example, in a case where the error correction capability of the encoding method applied to the page is low, there is a high possibility that the error correction of the read data will fail in the read operation with low reliability level. On the other hand, in a case where the error correction capability of the encoding method applied to the page is high, there is a high possibility that the error correction of the read data will succeed even with the read operation with low reliability level.

Therefore, the read method selection unit 106 may select a read operation to be executed first on the basis of a combination of the reliability index given from the reliability estimation unit 104 and the correction capability information given from the error correction capability management unit 105.

When the read operation to be executed first is selected in the read sequence as described above, the read method selection unit 106 notifies the command issuing unit 102 of the selected read operation.

The command issuing unit 102 issues a read command for causing the nonvolatile memory 20 to execute the read operation selected by the read method selection unit 106 and input the issued read command with respect to the command processing unit 21 of the nonvolatile memory 20. With respect to this, the command processing unit 21 drives the driving unit 22 and a sense amplifier 241 and a data latch 242 of the column module 24 in accordance with the input read command, thereby reading the target data from the physical address of the memory cell array 23. The read data is transferred to the ECC unit 13 of the memory controller 10 via the memory I/F 16 (see FIG. 1), and error correction is executed.

One read sequence is associated with one read request received from the host device 30. The read sequence includes one or more read operations that are sequenced in order. Each read operation uses one of the plurality of read methods. The command issuing unit 102 manages information for determining which read operation in the read sequence to be executed as a current read operation. For example, the command issuing unit 102 manages a sequence number of the current read operation among the read operations included in the read sequence by using a counter (not shown). In a case where a read method for a first read operation in the read sequence is dynamically determined according to the reliability index, that is, in a case where the reliability index is used to determine whether the first read operation in the read sequence to be skipped or not, the command issuing unit 102 determines whether or not the current read operation is the first read operation in the read sequence. Then, the command issuing unit 102, for the first read operation, issues a read command designating a read method dynamically selected by the read method selection unit 106. Also, the command issuing unit 102, for a second or later read operations in the read sequence, issues a read command designating a read method statically defined (i.e., pre-determined) in the read sequence. When the ECC unit 13 succeeds in decoding read data transferred from the non-volatile memory 20 with respect to the issued read command, the read sequence for the current read request is completed. The command issuing unit 102 resets the information for determining which read operation in the read sequence to be executed for the current read request to prepare for receiving of a next read request from the host device 30. Note that the information for determining which read operation in the read sequence to be used is not limited to the sequence number. For example, in a case where a read method only for the first read operation in the read sequence is dynamically determined according to the reliability index, the information may be information that can determine whether or not the current read operation is the first read operation in the read sequence.

Figure 4:
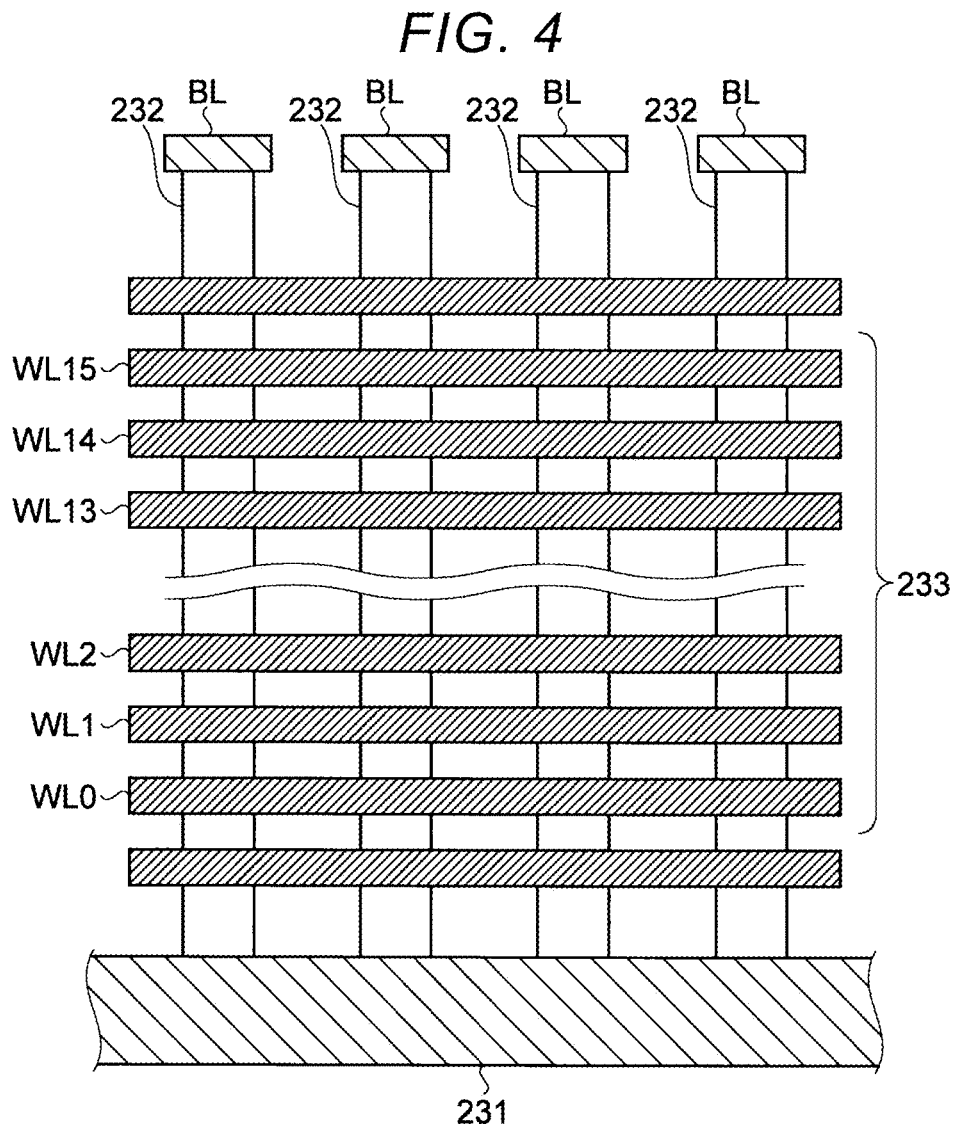
FIG. 4 is a cross-sectional view illustrating an example of a memory cell array having a three-dimensional NAND structure.
Figure 5:
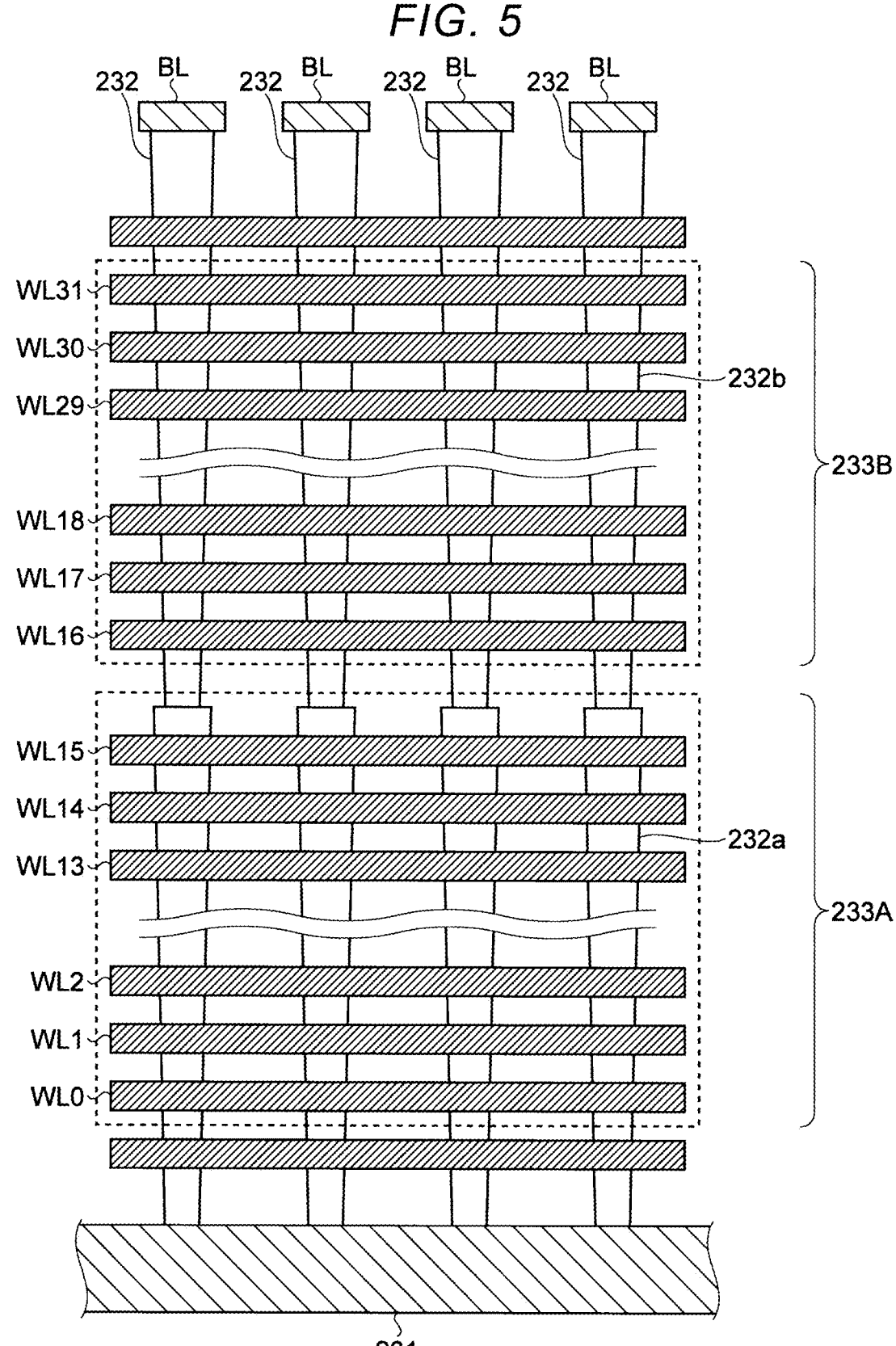
FIG. 5 is a cross-sectional view illustrating another example of the memory cell array having the three-dimensional NAND structure.

Here, among the characteristic information items described above, the physical position will be described. For example, in a case where the memory cell array 23 is a memory chip having a three-dimensional NAND structure, it is considered that the physical position greatly affects the reliability level. For example, in the case where the memory cell array 23 has a 16-layer three-dimensional NAND structure as shown in FIG. 4, the reliability level when executing the read operation on, for example, word lines WL0 to WL1 of the lower (i.e., deeper) layers may be lower than the reliability level when the read operation is executed on word lines WL 14 to WL 15 of the upper (i.e., shallower) layers. Similarly, as shown in FIG. 5, for example, in a case where the memory cell array 23 has a three-dimensional NAND structure in which 16 layers are stacked in two stages, the reliability level when executing the read operations for the word lines WL0, WL1, WL16, and WL17 of the lower layers of their respective stage may be lower than the reliability level when executing the read operations for the word lines WL14, WL15, WL30, and WL 31 of the upper layers of their respective stage, for example. In FIGS. 4 and 5, each BL represents a bit line, each of the WL0 to WL15 represents a word line, reference numeral 231 represents a semiconductor substrate, each of 232, 232*a* and 232*b* represents a via electrically connecting layers, and 233, 233A, and 233B represent a stage (also referred to as a tier) with 16 layers as one unit. In addition, in the present description, it is assumed that the upper layer side of each stage is shallow and the lower layer side is deep. Therefore, in this description, the lowermost layer of each stage is the deepest layer, and the uppermost layer of each stage is the shallowest layer.

Therefore, in the case where the memory cell array 23 has the three-dimensional NAND structure, if the "physical position" indicates a word line provided near the lower layer of each of stages 233/233A/233B (for example, WL0 to WL1), the reliability estimation unit 104 according to the present embodiment may operate to generate a reliability index indicating that the reliability level is low.

Figure 6:
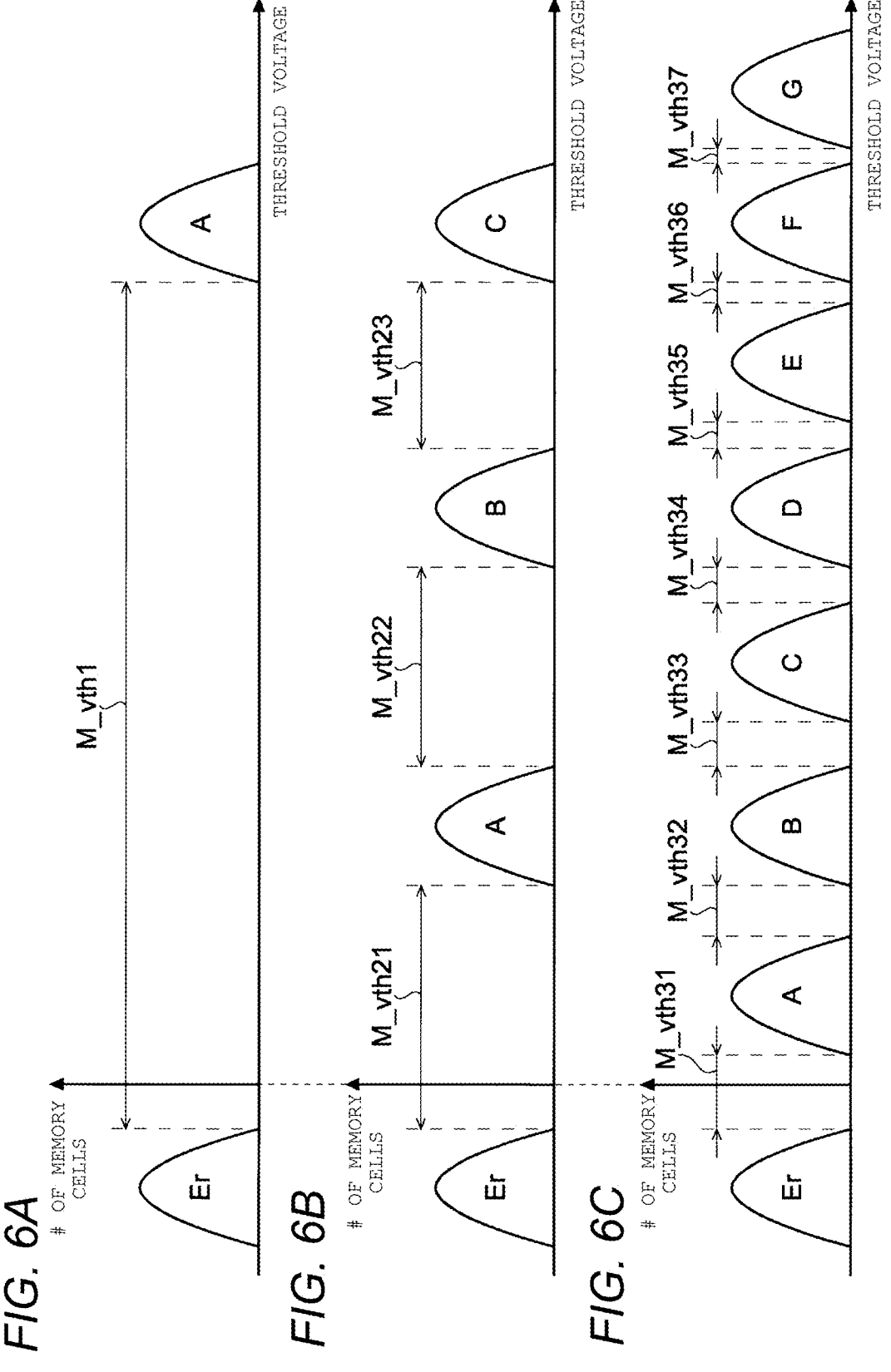
FIGS. 6A to 6C are diagrams illustrating examples of threshold voltage distributions and Vth margins in SLC, MLC, and TLC modes.

In addition, the reliability level when executing the read operation may be different depending on the writing mode used when the data to be read has been written. For example, as shown in FIG. 6, three margins M_vth21 to M_vth23 (see FIG. 6B) between adjacent two of the four threshold voltage distributions (Er to C states) of the memory cell in which data is recorded in the MLC mode are smaller than the margin M_vth1 (see FIG. 6A) between two threshold voltage distributions (Er and A states) of the memory cell in which data is recorded the SLC mode. Therefore, there is a tendency that the BER is higher in reading from the page in which data is recorded in the MLC mode than in reading in the page in which data is recorded in the SLC mode.

Similarly, the seven margins M_vth31 to M_vth37 (see FIG. 6C) between adjacent two of the respective eight threshold voltage distributions (Er to G states) of the memory cell in which data is recorded in the TLC mode, is smaller than the three margins M_vth21 to M_vth23 (see FIG. 6B) of the MLC mode. Therefore, there is a tendency that the BER is higher in reading on the page in which the data is recorded in the TLC mode compared with the MLC mode. Therefore, the reliability estimation unit 104 according to the present embodiment may operate to generate a reliability index indicating different reliability level according to the "writing mode" used upon writing the read target data.

Figures 11, 12:
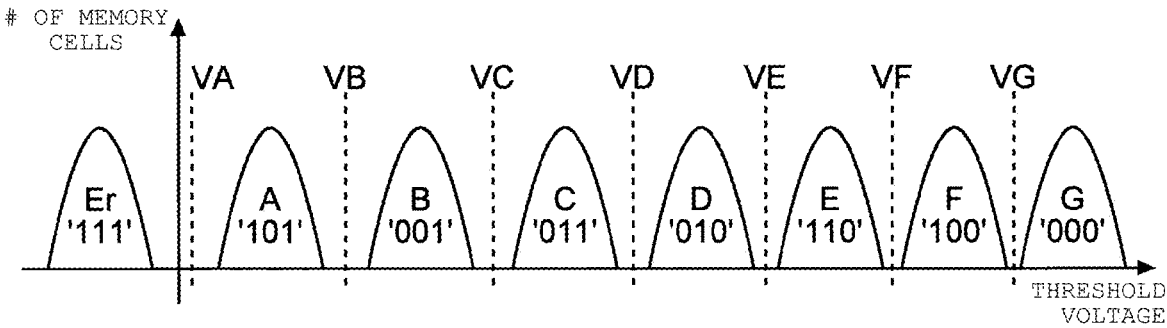
FIG. 11 is a diagram illustrating another example of the threshold voltage distribution and the read levels in the TLC mode.
FIG. 12 is a diagram illustrating another example of the read levels and the number of read levels to respective lower, middle, and upper pages of the TLC mode shown in FIG. 11.

In addition, even in the case of the read operation for the same word line, in a case where one memory cell group corresponds to plurality of pages, the reliability level when executing the read operation for each page may be different from each other. This will be described using an example of the case where the memory cell group includes the MLC, TLC and QLC, respectively. FIG. 7 is a diagram illustrating an example of the threshold voltage distribution of the MLC, and FIG. 8 is a diagram illustrating an example of the read levels assigned to lower and upper pages of the MLC illustrated in FIG. 7, and the numbers of read levels. FIG. 9 is a diagram illustrating an example of the threshold voltage distribution of the TLC, and FIG. 10 is a diagram illustrating an example of the read levels assigned to lower, middle, and upper pages of the TLC illustrated in FIG. 9, and the numbers of read levels. FIG. 11 is a diagram illustrating another example of the threshold voltage distribution of the TLC, and FIG. 12 is a diagram illustrating another example the read levels assigned to lower, middle, and upper pages of the TLC illustrated in FIG. 11, and the numbers of read levels.

As shown in FIGS. 7 and 8, in order to read out the four threshold voltage distributions (Er to C states) of the MLC, the number of read levels set for the LOWER page and the UPPER page is 2 and 1, respectively. The reliability level of reading the LOWER page in which two read levels VA and VC are set tends to be lower than that of reading the UPPER page in which one read level VB is set.

Similarly, as shown in FIGS. 9 and 10, in order to read out the eight threshold voltage distributions (Er to G states) of the TLC from memory cells written according to a 2/3/2 coding method, the number of read levels set for the LOWER page, the MIDDLE page, and the UPPER page is 2, 3, and 2, respectively. The reliability level of reading the MIDDLE page in which three read levels VB, VD, and VF are set is lower than that of reading the LOWER page and the UPPER page in each of which two read levels are set.

In addition, as shown in FIGS. 11 and 12, in order to read out the eight threshold voltage distributions (Er to G states) of the TLC from memory cells written according to a 1/3/3 coding method, the number of read levels set for the LOWER page, the MIDDLE page, the UPPER page is 1, 3, and 3. The reliability level of reading the MIDDLE page and the UPPER page in each of which the three read levels are set, is lower than that of the LOWER page in which one read level is set.

The reliability estimation unit 104 according to the present embodiment, in a case where the "page type" indicates a page in which more read levels are set than other pages, the reliability estimation unit 104 may operate to generate the reliability index indicating that the reliability level is low.

Furthermore, the reading between the threshold voltage distribution having the lowest voltage (also, referred to as the Er state) and the threshold voltage distribution having the lowest voltage next to the Er state (also, referred to as the A state) tends to cause an error. Therefore, in a case where the "page type" indicates the page in which the read level provided at the boundary between the Er state and the A state, the reliability estimation unit 104 according to the present embodiment may be operated to generate reliability index indicating the reliability level is low. For example, a lower page in the MLC mode with the 2/1 coding method, a lower page in the TLC mode with the 2/3/2 coding method, and a middle page in the TLC mode with the 1/3/3 coding method may have a lower reliability level than that of the other pages, respectively.

On the other hand, the threshold voltage distribution in which the voltage is high easily shifts in the low voltage direction due to the influence of data retention. This means that the gap between the threshold voltage distributions on the high voltage side tends to narrow due to the influence of data retention as compared with the gap between the threshold voltage distributions on the low voltage side. Therefore, the reading of these threshold voltage distributions tends to cause errors. Therefore, the fact that the operation is a read operation on the page in which the read level provided at the boundary between the threshold voltage distribution having the highest voltage in a particular "writing mode" and the threshold voltage distribution having the next highest voltage is determined with the "writing mode" and "page type", and in such situations, the reliability estimation unit 104 according to the present embodiment may be operated to generate reliability index indicating that the reliability level is low.

In the MLC illustrated in FIGS. 6B, 7 and 8, as the voltage is higher, the narrower the gap between states due to the influence of data retention. Therefore, for example, it is likely that an error is more likely to occur in the reading between the C state and the B state on the high voltage side than in the reading between Er state and the A state on the low voltage side. Therefore, in a case where "writing mode" indicates the MLC mode and the "page type" indicates the page in which the read level is between the states on the high voltage side (for example, the LOWER page in which the read level VC is set in order to distinguish between the C state and the B state), the reliability estimation unit 104 may be operated to generate the reliability index indicating that the reliability level is low with the read operation.

Similarly, in the TLC illustrated in FIG. 6C, FIG. 9 and FIG. 10 or FIGS. 11 and 12, as the voltage is higher, the gap between states becomes narrower due to the influence of data retention. In a case where the "writing mode" indicates the TLC mode and the "page type" indicates a page in which read level is between states at the high voltage side (for example, the UPPER page in which the read level VG is set for distinguishing between the G state and the F state), the reliability estimation unit 104 may be operated to generate the reliability index indicating that the reliability level is low with the input of the read operation.

Figure 13:
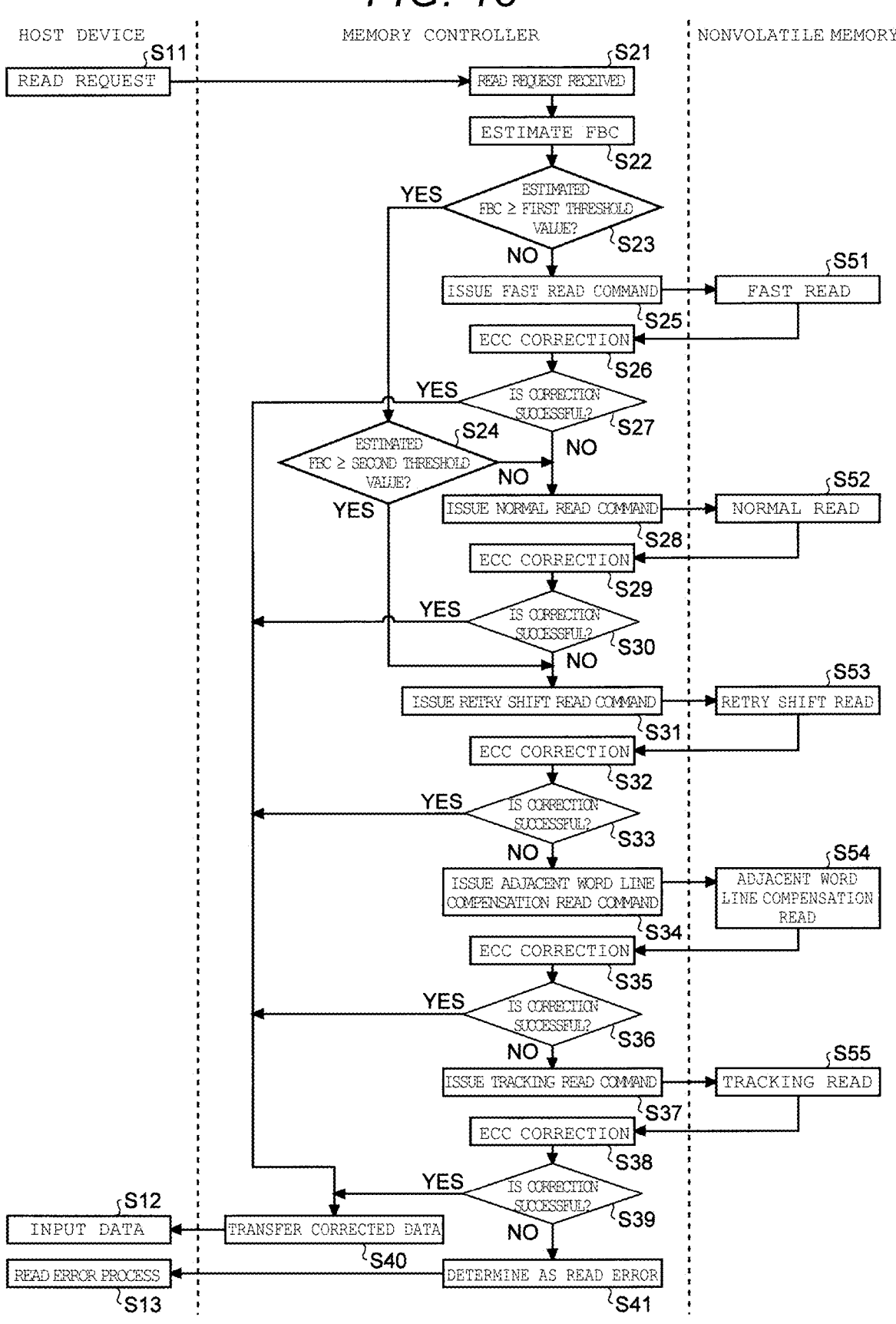
FIG. 13 is a flow diagram illustrating an example of the read operation according to the first embodiment.

Next, the read operation according to the present embodiment will be described in detail with reference to the drawings. FIG. 13 is a flow diagram illustrating an example of a read operation according to the present embodiment. In the FIG. 13 and the following description, a case of executing the read operation according to a request from the host device 30 (hereinafter, also referred to as a host read). However, the present disclosure is not limited thereto, and the same also applies to a case where an event accompanied by the read operation such as garbage collection, refresh, patrol read, or wear leveling. In addition, in FIG. 13 and the following description, a hard decision read (also, referred to as a hard bit read) for reading the data having the hard decision value from the memory cell is given as an example. However, the present disclosure is not limited thereto, and the same also applies to soft decision for reading out the data of the soft decision value from the memory cell (also, referred to as a soft bit read). Furthermore, in FIG. 13 and the following description, as a basic operation, the read sequence for executing the read operation is shown in order from the shortest read time period (for example, the FAST read, the normal read, the retry shift read, the adjacent word line compensation read, and tracking read). However, it is not limited to such a read sequence, and other read sequences may be employed.

In the operation example shown in FIG. 13, first, the read request (S11) from the host device 30 is received by the read request processing unit 101 of the memory controller 10 (S21). In the related art, the read request processing unit 101 receiving the read request converts the logical address included in the read request into a physical address using an address conversion table, and inputs the physical address to the command issuing unit 102. When receiving the physical address, the command issuing unit 102 issues a read command designating the read operation in accordance with a predetermined read sequence and the physical address to be read to the command processing unit 21 in the nonvolatile memory 20. Accordingly, in the read command that is to be issued first in response to the read request, the FAST read set as the first to be executed in the read sequence is designated.

On the other hand, in the present embodiment, the read request processing unit 101 in which the read request is received converts the logical address included in the read request into the physical address by using the address conversion table, inputs the physical address obtained in that manner to the characteristic information storage unit 103, and instructs the command issuing unit 102 to issue the read command. In the embodiment, the characteristic information storage unit 103 inputs the characteristic information specified from the physical address to the reliability estimation unit 104. The reliability estimation unit 104 estimates the FBC as the reliability index relating to data to be read from the corresponding physical address by using a part or all of the input characteristic information (S22), and inputs the generated reliability index to the read method selection unit 106.

In addition to the characteristic information storage unit 103, or in place of the characteristic information storage unit 103, the error correction capability management unit 105 may be provided. The read request processing unit 101 that received the read request in step S21 transmits the specified physical address to the error correction capability management unit 105. In that case, the error correction capability management unit 105 inputs the correction capability information determined on the basis of the physical address to the read method selection unit 106.

Next, the read method selection unit 106 determines whether or not to skip the FAST read operation on the basis of the reliability index and/or correction capability information. In this example, the read method selection unit 106 determines whether the estimated FBC is equal to or greater than a preset first threshold value (S23).

In a case where the estimated FBC is lower than the first threshold value (S23; NO), the read method selection unit 106 selects the FAST read operation as the read operation, and notifies the command issuing unit 102 of the selection result. With respect to the instruction from the read request processing unit 101, the command issuing unit 102 issues the read command for executing the FAST read operation (S25) and inputs the read command to the command processing unit 21 of the nonvolatile memory 20. As a result, the read operation initially executed in response to the read request from the host device 30 becomes the FAST read operation. The command processing unit 21 executes the FAST read operation in accordance with the read command of the FAST read operation (S51). The read data obtained in this manner is transferred from the data latch 242 to the ECC unit 13 of the memory controller 10 via the memory bus 18. The ECC unit 13 performs error correction on the transferred read data (S26). In a case where this error correction is successful (S27; YES), the present operation proceeds to step S40. On the other hand, in a case where the error correction fails (S27; NO), this operation proceeds to step S28.

If it is determined in step S23 that the estimated FBC is greater than or equal to the first threshold value (S23; YES), the read method selection unit 106 proceeds to step S24 so as to skip the FAST read operation. Therefore, executing the FAST read operation as a first operation in the read sequence is avoided. In step S24, the read method selection unit 106 determines whether or not to skip the next read operation (normal read operation in the present description) on the basis of the reliability index and/or correction capability information. In this example, the read method selection unit 106 determines whether the estimated FBC is equal to or greater than a preset second threshold value (S24). In some embodiments, the normal read operation is not included in the read sequence and the retry shift read operation is executed next to the FAST read operation. In this case, Step S24 Yes branches to Step S34 instead of S31, Step S24 No branches to Step S31 instead of S28, respectively, meaning that Step S24 determines whether the retry shift read operation is to be skipped or not.

If the error correction in step S26 has failed (S27; NO), or in a case where the estimated FBC is lower than the second threshold value (S24; NO), the read method selection unit 106 selects the normal read operation as the read operation and notifies the selection result to the command issuing unit 102. The command issuing unit 102 issues the read command for executing the normal read operation in response to the instruction from the read request processing unit 101 (S28), and inputs the read command to the command processing unit 21 of the nonvolatile memory 20. The command processing unit 21 executes the normal read operation in accordance with the read command of the normal read operation (S52). The read data obtained in this manner is transferred from the data latch 242 to the ECC unit 13 of the memory controller 10 via the memory bus 18. The ECC unit 13 executes error correction on the transferred read data (S29). In a case where this error correction is successful (S30; YES), this operation proceeds to step S40. On the other hand, in a case where the error correction fails (S30; NO), this operation proceeds to step S31.

If the error correction in step S29 fails (S30; NO), or when the estimated FBC is equal to or greater than the second threshold value (S24; YES), the read method selection unit 106 selects the retry shift read, and notifies the command issuing unit 102 of the selection result. The command issuing unit 102 issues the read command for executing the shift read in response to the instruction from the read request processing unit 101 (S31), and inputs the read command to the command processing unit 21 of the nonvolatile memory 20. The command processing unit 21 executes the shift read according to the input read command of the shift read (S53). The read data obtained in this manner is transferred from the data latch 242 to the ECC unit 13 of the memory controller 10 via the memory bus 18. The ECC unit 13 performs error correction on the transferred read data (S32). In a case where this error correction is successful (S33; YES), this operation proceeds to step S40. On the other hand, in a case where the error correction fails (S33; NO), this operation proceeds to step S34. The number of retry shift read operations is not limited to one, and it may be executed a plurality of times while changing the shift value. That is, in a case where the error correction in step S32 fails (S33; NO), the command issuing unit 102 repeatedly executes the issuance of the read command (S31) for executing the shift read in which the shift value is changed by a predetermined number of times equal to or more than 2. However, in a case where the error correction in step S32 still fails (S33; NO), the present operation may proceed to step S34.

In step S34, the command issuing unit 102 issues the read command for executing an adjacent word line compensation read, which is the next read operation, according to the instruction from the control unit 11 in the case where the error correction in step S32 fails (S33; NO) and inputs the read command to the command processing unit 21 of the nonvolatile memory 20. The command processing unit 21 executes the adjacent word line compensation read (S54). The read data obtained in this manner is transferred from the data latch 242 to the ECC unit 13 of the memory controller 10 via the memory bus 18. The ECC unit 13 executes error correction on the transferred read data (S35). In a case where this error correction is successful (S36; YES), this operation proceeds to step S40. On the other hand, in a case where the error correction fails (S36; NO), this operation proceeds to step S37.

In step S37, the command issuing unit 102 issues the read command for executing a tracking read, which is the next read operation, with respect to an instruction from the control unit 11, in the case where the error correction in step S35 fails (S36; NO), and inputs the read command to the command processing unit 21 of the nonvolatile memory 20. The command processing unit 21 executes the tracking read operation according to the read command of the tracking read operation (S55). The read data obtained in this manner is transferred from the data latch 242 to the ECC unit 13 of the memory controller 10 via the memory bus 18. The ECC unit 13 executes the error correction on the transferred read data (S38). In a case where this error correction is successful (S39; YES), this operation proceeds to step S40. On the other hand, in a case where the error correction fails (S39; NO), this operation proceeds to step S41.

In step S40, the control unit 11 restores the original data (which is the same as the write data) from the error-corrected data (hereinafter, referred to as corrected data) stored in the buffer memory 14 (S40) and transfers the corrected data to the host device 30 (S12). On the other hand, in step S41, for example, the control unit 11 determines that the read operation for the read request (S11) fails (i.e., read error occurs) (S41), and the result is notified to the host device 30. With respect to this, the host device 30 executes a processing in a case of a read error (S13).

Figure 14:
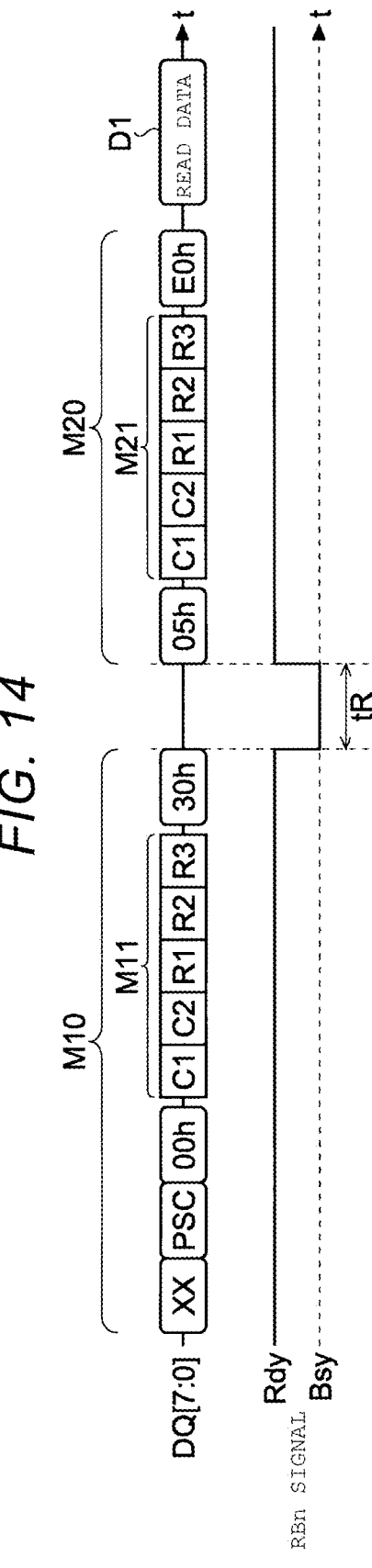
FIG. 14 is a diagram illustrating an example of a command sequence according to the first embodiment.

Next, commands given from the command issuing unit 102 to the command processing unit 21 of the nonvolatile memory 20 in steps S25, S28, S31, S34 and S37 in FIG. 13 will be described. FIG. 14 is a diagram illustrating an example of a command sequence according to the present embodiment. As shown in FIG. 14, the command output from the command issuing unit 102 to the command processing unit 21 includes a read command M10 and a data output command M20. The read command M10 includes a prefix "XX" designating a read operation (for example, one of the FAST read, the normal read, the shift read, the adjacent word line compensation read, and the tracking read), the designated "page select command (PSC)" of the page type in the corresponding physical address (for example, any one of the LOWER page, the MIDDLE page, and the UPPER page), and read commands ("00h to "30h") including the address unit M11 designating column addresses "C1" and "C2" and the row addresses "R1, R2, and R3".

Therefore, according to the present embodiment, in a case where the first read operation in each read sequence is changed, the prefix "XX" in the first read command M10 output from the command issuing unit 102 to the command processing unit 21 is changed. For example, in a case where the FAST read operation is first executed, the read command M10 including the prefix "XX" designating the FAST read operation is first output from the command issuing unit 102 to the command processing unit 21. In addition, in a case where the FAST read operation is skipped and the normal read operation is first executed, the read command M10 including the prefix "XX" designating the normal read operation is first output from the command issuing unit 102 to the command processing unit 21.

With respect to the read command M10 as described above, the command processing unit 21 controls the driving unit 22 to execute a read operation to read data from the corresponding page of the memory cell array 23. During this read operation, a ready and busy signal RBn output from the nonvolatile memory 20 to the memory controller 10 indicates a busy state Bsy. A period tR during which the ready and busy signal RBn indicates the busy state Bsy varies depending on the read operation being executed. For example, the period tR of the FAST read operation is shorter than that of the normal read operation or shift read operation, the period tR of the normal read operation or shift read operation is shorter than that of the adjacent word line compensation read operation, and the period tR of the adjacent word line compensation read operation is shorter than that of the tracking read operation.

Thereafter, when the ready and busy signal RBn indicates the ready state Rdy, the command issuing unit 102 outputs the data output command M20 to the command processing unit 21. The data output command M20 includes an address part M21 for designating the column addresses "C1" and "C2" and the row addresses "R1", "R2", and "R3". The command processing unit 21 outputs read data D1 to the memory controller 10 by controlling the column module 24 and the data latch 242 in accordance with the data output command M20.

As described above, in the present embodiment, prior to the execution of the read operation, the reliability level when executing each read operation on the page designated based on the read request is estimated, and the read operation to be executed first in the read sequence is selected on the basis of this estimation result. With such a configuration, according to the present embodiment, for example, in a case where the estimated reliability level is high, a read operation with a short read time period (for example, the FAST read) is executed first, and in a case where the estimated reliability level is low, it is possible to skip a read operation with low reliability level (for example, the FAST read) and execute the read operation with higher reliability level (for example, normal read, retry shift read, and the like) first. Therefore, it is possible to provide the memory system, the control method thereof, and the program capable of reducing read latency without lowering reliability level.

In addition, a comparative example is considered where there are no steps S22 to S23 in FIG. 13 and the FAST read operation is applied first regardless of the read to any page, for pages with a large number of FBCs. In almost all cases, the result of the determination in step S27 is NO, and even when the processing in steps S25 to S26 is executed, it is useless. On the other hand, in the present embodiment, in a case where the estimated reliability level is low, it is possible to execute a read operation with a high reliability level by skipping the read operation with low reliability level (for example, the FAST read operation), it is possible to reduce the read latency by the processing of steps S25 and S26.

Furthermore, another comparative example is considered where there is no steps S22 to S23 and S25 to S27 in FIG. 13, and any type of read on the page begins with the normal read operation without first applying FAST read operation, even when a page with a small number of FBCs is read, the read time period (that is, the time required for the data to become ready for transfer) becomes the normal read operation, and the read time period of the FAST read operation is not applied. With respect to this, in the present embodiment, since it is possible to apply the read time period of the FAST read operation to the page with a small FBC, it is possible to reduce the read latency.

In the above description, a case where the read operation to be executed first in the read sequence is selectively replaced based on the reliability level estimated when it is assumed that the read operation is performed for each page is given as an example. However, it is not limited to such a configuration. For example, in place of the determination based on the reliability level, or in addition to the determination based on reliability level, in a case where the characteristic information specified from the read request satisfies a certain condition, the read operation be executed first in the read sequence may be selectively replaced. For example, in a case where the "writing mode" indicates the QLC mode, the read operation to be executed first in the read sequence is set to the tracking read (steps S37 and S55 of FIG. 13), that is, it is possible to skip the operation from the FAST read to the adjacent word line compensation read. In addition, in a case where the "writing mode" indicates the SLC mode or the MLC mode, the FAST read is executed without skipping the FAST read in the read sequence, and in a case where the "writing mode" indicates the TLC mode, the FAST read can be skipped in the read sequence.

Furthermore, in a case where the "writing mode" indicates the 2/3/2 coding method, in a case where "page type" indicates the LOWER page or UPPER page, the FAST read operation is executed in the read sequence without skipping the FAST read operation, and in a case where the "page type" indicates the MIDDLE page, the FAST read may be skipped in the read sequence. Similarly, in a case where the "writing mode" indicates the 1/3/3 coding method, in a case where the "page type" indicates the LOWER page, the FAST read operation is executed in the read sequence without skipping of the FAST read operation, and in a case where the "page type" indicates MIDDLE page or the UPPER page, the FAST read operation may be skipped in the read sequence.

Furthermore, in a case where the "writing state" indicates that the writing of the data corresponding to the target block is not completed or the data is not written on the word line in an adjacent of the word line to be read (i.e., the adjacent word line), the read operation to be executed first in the read sequence is defined as the adjacent word line compensation read (steps S34 and S54 of FIG. 13), that is, it is possible to skip the operation from the FAST read to the retry shift read. Furthermore, in a case where the "temperature" is equal to or lower than a preset threshold temperature, it is also possible to skip the FAST read in the read sequence.

Second Embodiment

Next, a memory system, a control method thereof, and a program thereof according to the second embodiment will be described in detail with reference to the drawings. In the following description, the same configurations and operations as those in the first embodiment are cited, and overlapping descriptions are omitted.

In the first embodiment, a case where the case where the configuration for estimating the reliability level when executing the read operation and selecting the read operation based on the estimation result is incorporated in the memory controller 10 side. In the second embodiment, these configurations are incorporated in the nonvolatile memory 20.

Figure 15:
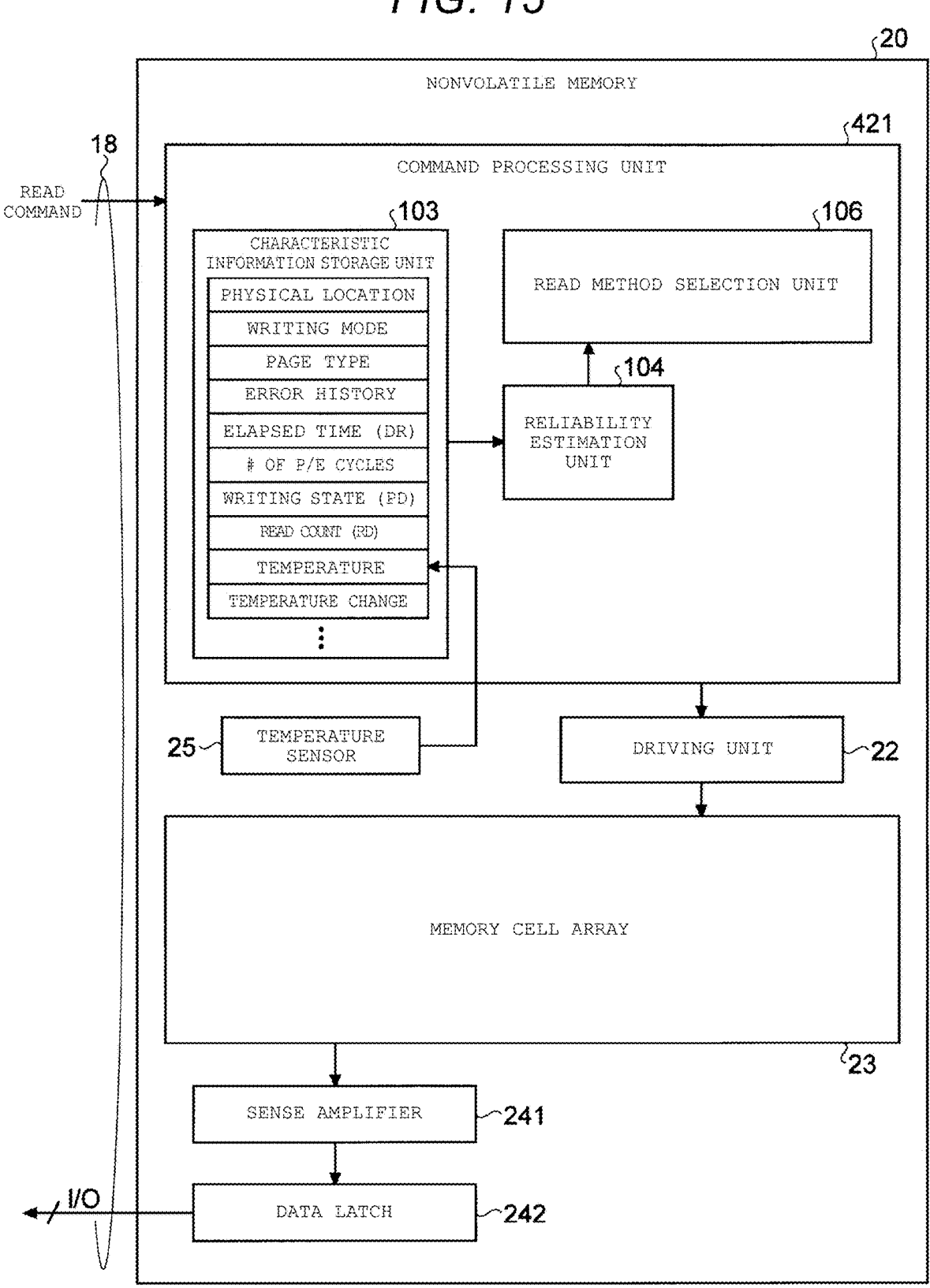
FIG. 15 is a block diagram illustrating a configuration example of a nonvolatile memory according to a second embodiment.

FIG. 15 is a block diagram illustrating a configuration example of the nonvolatile memory according to the present embodiment. As shown in FIG. 15, in the present embodiment, the characteristic information storage unit 103, the reliability estimation unit 104, and the read method selection unit 106 in the first embodiment are implemented in a command processing unit 421 in the nonvolatile memory 20.

Figure 16:
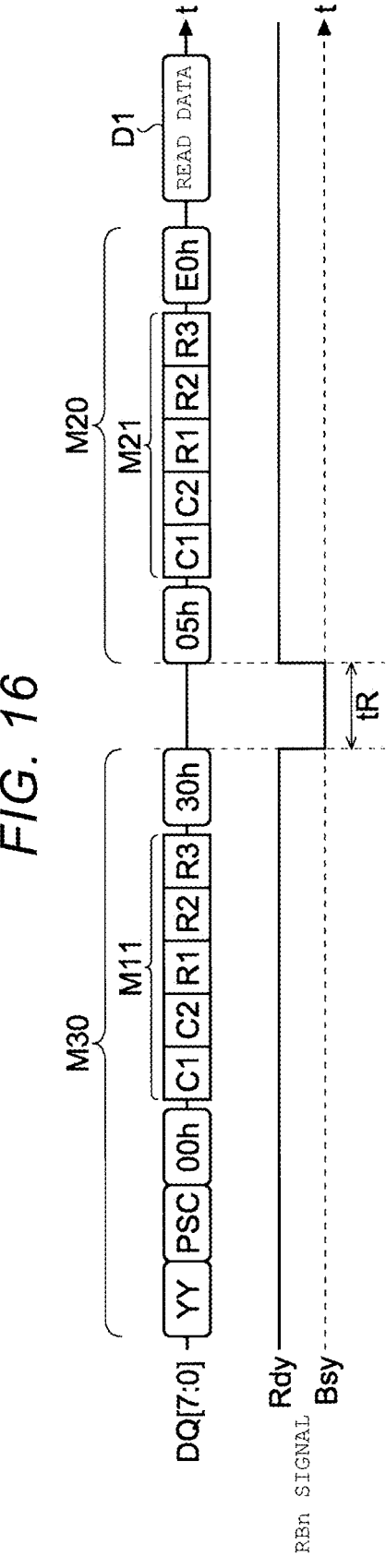
FIG. 16 is a diagram illustrating an example of a command sequence according to the second embodiment.

In the configuration shown in FIG. 15, similar to the first embodiment, a read command is given from the command issuing unit 102 of the memory controller 10 to the command processing unit 421 of the nonvolatile memory 20. However, in the present embodiment, as shown in FIG. 16, in the read command M30 sent from the command issuing unit 102 to the command processing unit 421 for the first time, the prefix designating the read operation to be executed is a prefix "YY" instructing that the read method to be executed is to be selected in the command processing unit 421 in the nonvolatile memory 20. When such a read command is given from the command issuing unit 102, the command processing unit 421 inputs the physical address designated by the read command with respect to the characteristic information storage unit 103. For a read command of the second time or later in the read sequence, similarly to the first embodiment, the prefix of the read command sent from the command issuing unit 102 in the memory controller 10 to the command processing unit 421 in the nonvolatile memory 20 is a prefix that explicitly designates the read operation to be executed.

Similar to the first embodiment, with respect to the physical address, the characteristic information storage unit 103 outputs the characteristic information related to the page designated by the physical address to the reliability estimation unit 104, and the reliability estimation unit 104 estimates the reliability index by using all or a part of the characteristic information and outputs the estimated reliability index to the read method selection unit 106. The correction capability information related to the page designated by the physical address may be specified on the memory controller 10 side, for example, and the error correction capability information and the read command may be input from the command issuing unit 102 to the command processing unit 421.

The read method selection unit 106 selects a read operation to be executed on the basis of either the reliability index (estimated FBC) or correction capability information that is input or a combination thereof. The command processing unit 421 controls the driving unit 22, the sense amplifier 241, and the data latch 242 in accordance with the read operation selected by the read method selection unit 106, whereby executing the read operation selected by the read method selection unit 106.

As described above, among the read commands issued from the command issuing unit 102 to the command processing unit 421 one time or more with respect to one read request, for the first read command, the right to select the first read operation is given to the command processing unit 421. Accordingly, the command processing unit 421 executes the read operation selected by the read method selection unit 106 with respect to the first read command. However, among the read commands for one read request, similar to the first embodiment, for the second and subsequent read commands to be retried are sequentially executed, the read command explicitly designating a read method is issued from the command issuing unit 102 to the command processing unit 421.

Thereafter, the read data read with the read operation is transferred to the ECC unit 13 of the memory controller 10 via the memory bus 18 and decoded. In a case where the decoding is successful, the restored data is transferred to the host device 30 via the host bus 31. On the other hand, if the decoding fails, similar to the first embodiment, the read command explicitly specifying the read method is issued from the command issuing unit the command issuing unit 102 of the memory controller 10 to the command processing unit 421 of the nonvolatile memory 20 in accordance with a preset retry read sequence. On the other hand, the command processing unit 421 controls the driving unit 22, the sense amplifier 241, and the data latch 242 on the basis of the instructed read operation, thereby executing the reading of the target data.

In the present embodiment, the case where the correction capability information is managed on the memory controller 10 side is given as an example. However, it is also possible to manage the correction capability information related to the nonvolatile memory 20 side. In this case, when the data to be written is coded, the ECC unit 13 notifies the command processing unit 421 of the correction capability information indicating the encoding method used for this encoding or the correction capability thereof and the physical address indicating the storage position (e.g., the page position) of the data to be written. Accordingly, for example, in the error correction capability management unit provided in the command processing unit 421, it is possible to manage the encoding method applied by the ECC unit 13 or the correction capability of the data stored in each page.

In the present embodiment, the information indicating the temperature detected by the temperature sensor 25 may be directly stored in the characteristic information storage unit 103 in the command processing unit 421.

As described above, in the present embodiment, in the nonvolatile memory 20 side, the reliability level when each read operation is executed on the page specified on the basis of the read request before the execution of the read operation, and the read operation to be executed is selected on the basis of the estimation result. According to this configuration, according to the present embodiment, similar to the first embodiment, the read operation to be executed first in the read sequence can be selectively switched on the basis of the reliability level estimated in the case where it is assumed that the read operation is executed. For example, in a case where the estimated reliability level is high, the read operation with a short read time period (for example, FAST read operation) is executed first, and in a case where the estimated reliability level is low, the read operation with low reliability level (for example, FAST Read operation) may be skipped and a more reliable read operation (for example, normal read operation, retry shift read operation, or the like) may be executed first.

Thereby, it is possible to provide the memory system, the control method thereof, and the program capable of reducing read latency without lowering reliability level.

Since other configurations, operations, and effects may be similar to those of the above-described first embodiment, a detailed description thereof will be omitted here.

In the second embodiment, the case where the read command M30 including the prefix "YY" is the first read command among the read commands issued one or more times for one read request is exemplified. However, it is not limited to this case, and it is possible to use a read command with respect to be issued the second time or later, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
  a memory device including:
    a nonvolatile memory cell array; and
    a control circuit configured to execute a plurality of read methods; and
  a memory controller configured to:
    determine, on the basis of a writing mode used when read target data was written to the nonvolatile memory cell array, a read instruction to be outputted to the memory device to cause the control circuit to execute one of the plurality of read methods to read the read target data, the writing mode corresponding to the number of bits of a value stored in one memory cell of the nonvolatile memory cell array; and output the determined read instruction to the memory device.

2. The memory system according to claim 1, wherein the memory controller is configured to receive a read request designating the read target data from a host, and the determined read instruction is an initial read instruction of one or more read instructions outputted to the memory device in a read sequence corresponding to the read request.

3. The memory system according to claim 1, wherein the plurality of read methods include at least a first read method and a second read method, and the memory controller is configured to:

in a case where the writing mode is a first mode, determine a first read instruction as the read instruction, the first read instruction being outputted to cause the control circuit to execute the first read method; and in a case where the writing mode is a second mode which is different from the first mode, determine a second read instruction as the read instruction, the second read instruction being outputted to cause the control circuit to execute the second read method.

4. The memory system according to claim 3, wherein the first mode is a single-level cell (SLC) mode or a multi-level cell (MLC) mode, and the second mode is a quad-level cell (QLC) mode.

5. The memory system according to claim 4, wherein a first time period from when the first read instruction is outputted to the memory device until data read by executing the first read method becomes ready to be transferred from the memory device is shorter than a second time period from when the second read instruction is outputted to the memory device until data read by executing the second read method becomes ready to be transferred from the memory device.

6. The memory system according to claim 4, wherein the memory device is configured to output ready-busy-state information to the memory controller, and a first time period during which the ready-busy-state information corresponding to the first read method indicates a busy state is shorter than a second time period during which the ready-busy-state information corresponding to the second read method indicates the busy state.

7. The memory system according to claim 4, wherein the memory device takes a first time period to complete the first read method, and the memory device takes a second time period to complete the second read method, the second time period being longer than the first time period.

8. The memory system according to claim 1, wherein the read instruction includes a first part indicating the one of the plurality of read methods, and at least the first part is based on the writing mode.

9. The memory system according to claim 8, wherein the read instruction further includes a second part indicating a row address associated with the read target data and a third part indicating a column address associated with the read target data.

10. The memory system according to claim 1, wherein the memory controller is further configured to receive a read request designating the read target data from a host, and the memory controller is configured to:

determine the read instruction, further on the basis of the number of read instructions previously outputted to the memory device in a read sequence corresponding to the read request.

11. The memory system according to claim 1, wherein the memory controller is connected to the memory device via a bus, and the memory controller is further configured to output a command latch enable signal and an address latch enable signal to the memory device via the bus.

12. A memory system comprising:

a memory device including:

a nonvolatile memory cell array; and a control circuit configured to execute a plurality of read methods; and a memory controller configured to:

determine, on the basis of a physical address associated with read target data, a read instruction to be outputted to the memory device to cause the control circuit to execute one of the plurality of read methods to read the read target data; and output the determined read instruction to the memory device.

13. The memory system according to claim 12, wherein the memory controller is configured to receive a read request designating the read target data from a host, and the determined read instruction is an initial read instruction of one or more read instructions outputted to the memory device in a read sequence corresponding to the read request.

14. The memory system according to claim 12, wherein the plurality of read methods include at least a first read method and a second read method, the memory device further includes a substrate, the nonvolatile memory cell array includes a plurality of blocks, each of the plurality of blocks being a unit of a data erase operation and including a plurality of memory cells at intersection locations of a plurality of word lines and a memory pillar, the plurality of word lines being stacked apart from each other in a first direction perpendicular to the substrate, the memory pillar passing through the plurality of word lines in the first direction, the plurality of word lines include:

a first word line which is closest to the substrate among the plurality of word lines;

a second word line adjacent to the first word line, and the memory controller is configured to:

in a case where the physical address corresponds to the first word line, determine a first read instruction as the read instruction, the first read instruction being outputted to cause the control circuit to execute the first read method; and in a case where the physical address corresponds to the second word line, determine a second read instruction as the read instruction, the second read instruction being outputted to cause the control circuit to execute the second read method.

15. The memory system according to claim 14, wherein a first time period from when the first read instruction is outputted to the memory device until data read by executing the first read method becomes ready to be transferred from the memory device is different from a second time period from when the second read instruction is outputted to the memory device until data read by executing the second read method becomes ready to be transferred from the memory device.

16. The memory system according to claim 14, wherein the memory device takes a first time period to complete the first read method, and the memory device takes a second time period to complete the second read method, the second time period being different from the first time period.

17. The memory system according to claim 12, wherein the read instruction includes a first part indicating the one of the plurality of read methods, a second part indicating the physical address including a row address and a column address, and at least the first part is based on the physical address.

18. The memory system according to claim 12, wherein the memory controller is connected to the memory device via a bus, and the memory controller is further configured to output a command latch enable signal and an address latch enable signal to the memory device via the bus.

19. A memory system comprising:
a memory device including:
  a nonvolatile memory cell array; and
  a control circuit configured to execute a plurality of read methods; and
a memory controller configured to output a read command with a read method designator to the memory device, wherein
the memory controller is configured to:
  select the read method designator to read read target data, on the basis of a writing mode used when the read target data corresponding to the read command was written to the nonvolatile memory cell array, from a plurality of read method designators each of which designates one of the plurality of read methods.

20. The memory system according to claim 19, wherein the memory controller is further configured to receive a read request designating the read target data from a host, and the read command is an initial read command of one or more read commands outputted to the memory device in a read sequence corresponding to the read request.

21. The memory system according to claim 19, wherein the memory controller is configured to output "00h-30h" as the read command.

22. The memory system according to claim 21, wherein the memory device further includes a command register and an address register, and the memory controller is configured to:
  when issuing the read command, output "00h" to the command register, then transmit a physical address to the address register, and conclude with "30h".

23. A memory system comprising:
a memory device including a nonvolatile memory cell array that includes first memory cells and second memory cells; and
a memory controller connected to the memory device via a bus and configured to:
  receive a first read request from a host;
  output a first read command, a first physical address, and first information to the memory device, the first physical address corresponding to the first memory cells storing first data that is target data of the first read request, each of the first memory cells storing a first number of bits;

receive a second read request from the host; and
  output a second read command, a second physical address, and second information to the memory device, the second physical address corresponding to the second memory cells storing second data that is target data of the second read request, each of the second memory cells storing a second number of bits, the second number of bits being different from the first number of bits, wherein
the second information is different from the first information.

24. The memory system according to claim 23, wherein the first read command is an initial read command of one or more read commands, each of which is outputted with a physical address same as the first physical address to the memory device during a period from when the memory controller receives the first read request until the memory controller transfers the first data to the host, and the second read command is an initial read command of one or more read commands, each of which is outputted with a physical address same as the second physical address to the memory device during a period from when the memory controller receives the second read request until the memory controller transfers the second data to the host.

25. The memory system according to claim 24, wherein the memory controller is further configured to output a third read command, a third physical address, and third information to the memory device after the memory controller outputs the first read command to the memory device before the memory controller transfers the first data to the host, the third physical address being same as the first physical address, the third read command is the same as the first read command, and the third information is different from the first information.

26. The memory system according to claim 23, wherein a first time period from when the memory controller outputs the first read command to the memory device until data read from the first memory cells becomes ready to be transferred from the memory device is longer than a second time period from when the memory controller outputs the second read command to the memory device until data read from the second memory cells becomes ready to be transferred from the memory device.

27. The memory system according to claim 23, wherein the memory device is configured to output ready-busy-state information to the memory controller, and a first time period from when the ready-busy-state information becomes a busy state in response to the memory device receiving the first read command until the ready-busy-state information becomes a ready state is longer than a second time period from when the ready-busy-state information becomes the busy state in response to the memory device receiving the second read command until the ready-busy-state information becomes the ready state.

28. The memory system according to claim 23, wherein the first number of bits are 4 bits, and the second number of bits are 1 bit or 2 bits.

29. The memory system according to claim 23, wherein the nonvolatile memory cell array includes a plurality of blocks, each of the plurality of blocks being a unit of a data erase operation, and a first block among the plurality of blocks includes the first memory cells and the second memory cells.

30. A memory system comprising:
a memory device including:
    a nonvolatile memory cell array including a plurality of blocks, each of the plurality of blocks being a unit of a data erase operation, the plurality of blocks including a first block; and
    a control circuit configured to execute a plurality of read methods; and
a memory controller configured to:
    receive a read request;
    determine, on the basis of whether the first block that is storing read target data of the read request is an open block or a closed block, a read instruction to be outputted to the memory device to cause the control circuit to execute one of the plurality of read methods to read the read target data; and
    output the determined read instruction to the memory device.

31. The memory system according to claim 30, wherein the plurality of read methods include at least a first read method and a second read method, and the memory controller is configured to:
    in a case where the first block is the open block, determine a first read instruction as the read instruction, the first read instruction being outputted to cause the control circuit to execute the first read method; and
    in a case where the first block is the closed block, determine a second read instruction as the read instruction, the second read instruction being outputted to cause the control circuit to execute the second read method.

32. The memory system according to claim 31, wherein a reliability level of data read from a physical address corresponding to a logical address specified in the read request using the first read method is different from a reliability level of data read from the physical address using the second read method.

33. The memory system according to claim 30, wherein the open block is a block that is not fully programmed, and the closed block is a block that is fully programmed.

* * * * *